US010446575B2

(12) United States Patent
Kim et al.

(10) Patent No.: US 10,446,575 B2
(45) Date of Patent: Oct. 15, 2019

(54) NONVOLATILE MEMORY DEVICE

(71) Applicant: SAMSUNG ELECTRONICS CO., LTD., Suwon-si, Gyeonggi-do (KR)

(72) Inventors: Chan-Ho Kim, Seoul (KR); Bong-Soon Lim, Seoul (KR); Pan-Suk Kwak, Seoul (KR); Hong-Soo Jeon, Suwon-si (KR)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/014,902

(22) Filed: Jun. 21, 2018

(65) Prior Publication Data

US 2019/0139978 A1 May 9, 2019

(30) Foreign Application Priority Data

Nov. 7, 2017 (KR) .................. 10-2017-0147611

(51) Int. Cl.
| H01L 29/76 | (2006.01) |
| H01L 27/115 | (2017.01) |
| H01L 27/11582 | (2017.01) |
| H01L 27/11573 | (2017.01) |
| G11C 16/08 | (2006.01) |
| G11C 16/24 | (2006.01) |
| H01L 27/1157 | (2017.01) |

(52) U.S. Cl.
CPC ........ *H01L 27/11582* (2013.01); *G11C 16/08* (2013.01); *G11C 16/24* (2013.01); *H01L 27/1157* (2013.01); *H01L 27/11573* (2013.01)

(58) Field of Classification Search
CPC ........... H01L 27/11582; H01L 27/1157; H01L 27/11573; G11C 16/24; G11C 16/08
See application file for complete search history.

(56) References Cited

U.S. PATENT DOCUMENTS

| 8,405,142 | B2* | 3/2013 | Katsumata | .......... H01L 29/7926 257/314 |
| 8,581,323 | B2* | 11/2013 | Uenaka | ................. H01L 27/105 257/316 |
| 8,680,604 | B2* | 3/2014 | Higashi | ............. H01L 27/11582 257/324 |
| 9,099,347 | B2* | 8/2015 | Yun | ..................... H01L 27/1157 |
| 9,165,937 | B2* | 10/2015 | Yip | ....................... H01L 27/115 |
| 9,224,747 | B2* | 12/2015 | Mizutani | ........... H01L 27/11556 |

(Continued)

Primary Examiner — Earl N Taylor
(74) Attorney, Agent, or Firm — F. Chau & Associates, LLC

(57) ABSTRACT

A three-dimensional (3D) nonvolatile memory includes a stacked structure that includes a plurality of conductive layers that alternate with and are spaced apart from each other by a plurality of interlayer insulating layers. The stacked structure includes a first cell region, a second cell region spaced apart from the first cell region, and a connection region between the first cell region and the second cell region. The connection region includes a first step portion that contacts the first cell region and has a stepped shape that descends in a direction approaching the second cell region, a second step portion that contacts the second cell region and has a stepped shape that descends in a direction approaching the first cell region, and a connection portion that connects the first cell region and the second cell region.

19 Claims, 33 Drawing Sheets

(56) References Cited

U.S. PATENT DOCUMENTS

| | | | | |
|---|---|---|---|---|
| 9,424,928 B2* | 8/2016 | Hwang | ............... | G11C 5/025 |
| 9,466,531 B2* | 10/2016 | Freeman | ........... | H01L 27/11548 |
| 9,515,084 B2* | 12/2016 | Oh | .................... | H01L 27/11548 |
| 9,515,087 B2* | 12/2016 | Son | ........................ | G11C 5/025 |
| 9,691,782 B1* | 6/2017 | Hwang | ............. | H01L 27/11565 |
| 2010/0207186 A1* | 8/2010 | Higashi | ............. | H01L 27/11578 |
| | | | | 257/314 |
| 2011/0115010 A1* | 5/2011 | Shim | ................ | H01L 27/11565 |
| | | | | 257/314 |
| 2012/0280299 A1* | 11/2012 | Yun | ..................... | H01L 27/1157 |
| | | | | 257/314 |
| 2013/0043509 A1* | 2/2013 | Cho | ................. | H01L 27/11526 |
| | | | | 257/208 |
| 2013/0161821 A1* | 6/2013 | Hwang | ............... | H01L 23/5283 |
| | | | | 257/773 |
| 2015/0001613 A1* | 1/2015 | Yip | ....................... | H01L 27/115 |
| | | | | 257/329 |
| 2015/0279852 A1* | 10/2015 | Mizutani | ........... | H01L 27/11556 |
| | | | | 257/315 |
| 2015/0371925 A1* | 12/2015 | Thimmegowda | ... | H01L 27/1157 |
| | | | | 257/751 |
| 2016/0111361 A1* | 4/2016 | Oh | .................... | H01L 27/11548 |
| | | | | 257/390 |
| 2016/0163726 A1* | 6/2016 | Tanzawa | ........... | H01L 27/11556 |
| | | | | 257/314 |

\* cited by examiner

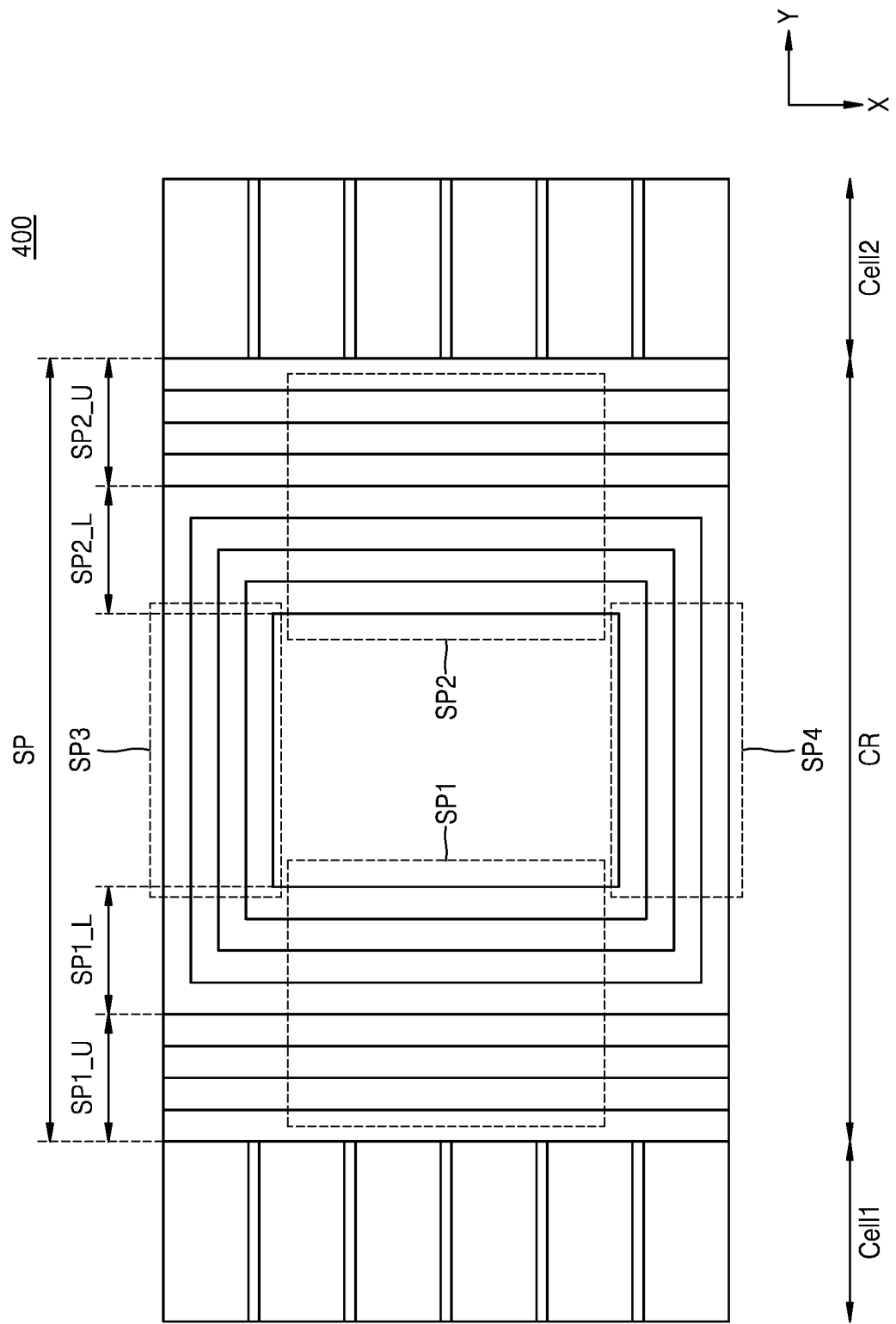

NONVOLATILE MEMORY DEVICE

CROSS-REFERENCE TO RELATED APPLICATION

This application claims priority under 35 U.S.C. § 119 from, and the benefit of, Korean Patent Application No. 10-2017-0147611, filed on Nov. 7, 2017 in the Korean Intellectual Property Office, the contents of which are herein incorporated by reference in their entirety.

BACKGROUND

Embodiments of the inventive concept are directed to a nonvolatile memory device, and more particularly, to a three-dimensional (3D) nonvolatile memory device that includes a vertical channel structure.

As one of the methods for improving integration density and miniaturization of a memory device, a 3D nonvolatile memory device including a vertical channel structure instead of a conventional two-dimensional (2D) structure has been developed. Due to integration density improvement and miniaturization of the 3D nonvolatile memory device, connection of wirings included in the 3D nonvolatile memory device is becoming complicated and there is a resistive-capacitive (RC) delay problem due to the increased length of the wirings.

SUMMARY

Embodiments of the inventive concept can provide a three-dimensional (3D) nonvolatile memory device having a high degree of integration and reduced resistive-capacitive (RC) delay.

According to an aspect of the inventive concept, there is provided a 3D nonvolatile memory, including: a stacked structure that includes a plurality of conductive layers that alternate with and are spaced apart from each other by a plurality of interlayer insulating layers, wherein the stacked structure includes a first cell region, a second cell region spaced apart from the first cell region, and a connection region between the first cell region and the second cell region, and the connection region includes a first step portion that contacts the first cell region and has a stepped shape that descends in a direction approaching the second cell region, a second step portion that contacts the second cell region and has a stepped shape that descends in a direction approaching the first cell region, and a connection portion that connects the first cell region and the second cell region.

According to another aspect of the inventive concept, there is provided a 3D nonvolatile memory, including: a lower region that includes a lower substrate and a peripheral circuit on the lower substrate; and a stacked structure on the lower region that includes a plurality of conductive layers that alternate with and are spaced apart from each other by a plurality of interlayer insulating layers. The stacked structure includes a first cell region, a second cell region spaced apart from the first cell region, and a connection region between the first cell region and the second cell region, and the connection region of the stacked structure includes a step portion that has a stepped shape that descends from a periphery of the connection region toward a center thereof.

According to another aspect of the inventive concept, there is provided a 3D nonvolatile memory, including: a lower region that includes a lower substrate and a peripheral circuit on the lower substrate; an upper substrate on the lower region; a stacked structure on the upper substrate that includes a plurality of conductive layers that alternate with and are spaced apart from each other by a plurality of interlayer insulating layers; and a plurality of contacts that electrically connect each of the plurality of conductive layers to the peripheral circuit. The stacked structure includes a first cell region, a second cell region spaced apart from the first cell region, and a connection region between the first cell region and the second cell region, the connection region includes a first step portion that contacts the first cell region and has a stepped shape that descends in a direction approaching the second cell region, and a connection portion that connects the first step portion and the second cell region. The plurality of contacts are disposed in the first step portion.

BRIEF DESCRIPTION OF THE DRAWINGS

FIGS. 13A and 13B respectively are a perspective view and a plan view of a 3D nonvolatile memory device according to an embodiment of the inventive concept.

DETAILED DESCRIPTION OF THE EMBODIMENTS

Figure 1:
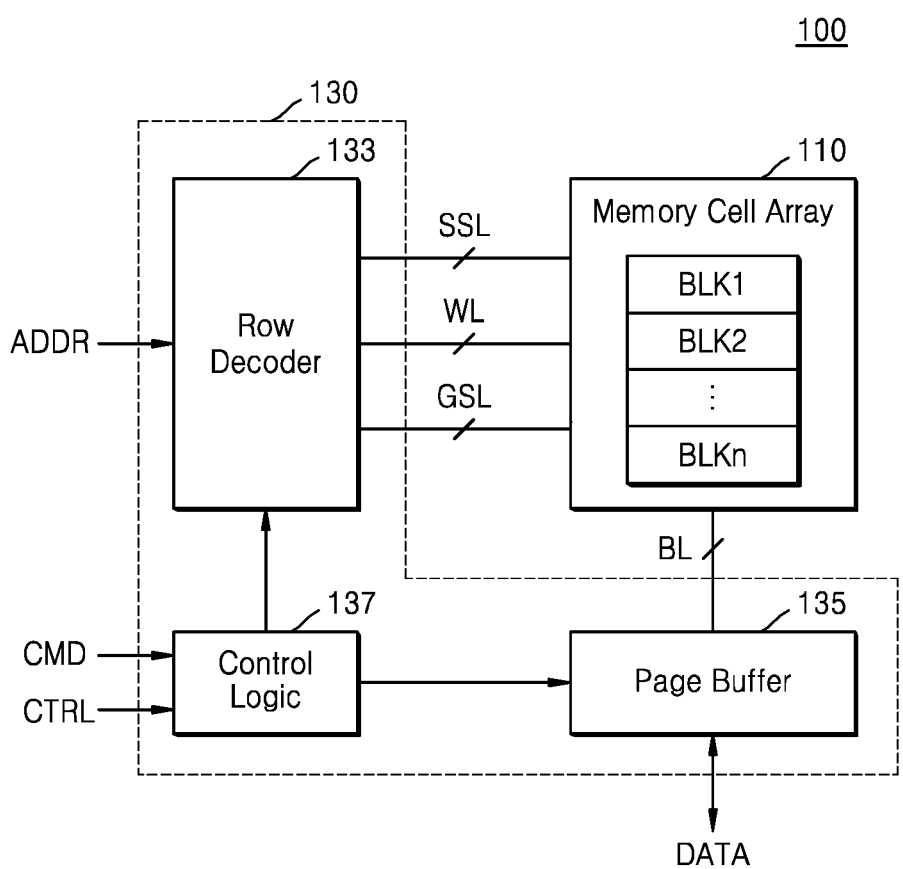
FIG. 1 is a block diagram of a three-dimensional (3D) nonvolatile memory device according to an embodiment of the inventive concept.

FIG. 1 is a block diagram of a three-dimensional (3D) nonvolatile memory device 100 according to an embodiment of the inventive concept.

Referring to FIG. 1, according to an embodiment, the 3D nonvolatile memory device 100 includes a memory cell array 110 and a peripheral circuit 130.

According to an embodiment, the memory cell array 110 includes a plurality of memory cell blocks BLK1 to BLKn, and each of the memory cell blocks BLK1 to BLKn includes a plurality of memory cells. The memory cell blocks BLK1 to BLKn are connected to the peripheral circuit 130 through bit lines BL, word lines WL, at least one string selection line SSL, and at least one ground selection line GSL. In more detail, the memory cell blocks BLK1 to BLKn are connected to a row decoder 133 through the word lines WL, the at least one string selection line SSL, and the at least one ground selection line GSL. Furthermore, the memory cell blocks BLK1 to BLKn are also connected to a page buffer 135 through the bit lines BL.

According to an embodiment, the peripheral circuit 130 receives an address ADDR, a command CMD, and a control signal CTRL from an external device, and exchanges data DATA with another external device outside the 3D nonvolatile memory device 100. The peripheral circuit 130 includes a control logic 137, a row decoder 133, and the page buffer 135. In addition, the peripheral circuit 130 may further include various sub circuits, such as an input/output circuit, a voltage generating circuit that generates voltages for operating the 3D nonvolatile memory device 100, and an error correction circuit for correcting errors in the data DATA read from the memory cell array 110.

According to an embodiment, the control logic 137 is connected to the row decoder 133, the voltage generator, and the input/output circuit. The control logic 137 controls operations of the 3D nonvolatile memory device 100. The control logic 137 generates various internal control signals used in the 3D nonvolatile memory device 100 in response to the control signal CTRL. For example, the control logic 137 adjusts a voltage level provided to the word lines WL and the bit lines BL when performing memory operations such as a program operation or an erase operation.

According to an embodiment, the row decoder 133 selects at least one of the plurality of memory cell blocks BLK1 to BLKn in response to the address ADDR and selects at least one word line WL of the selected memory cell block BLK1 to BLKn, the at least one string selection line SSL, and the at least one ground selection line GSL. The row decoder 133 transmits a voltage for performing a memory operation to the word line WL of the selected memory cell blocks BLK1 to BLKn.

According to an embodiment, the page buffer 135 is connected to the memory cell array 110 through the plurality of bit lines BL. The page buffer 135 can operate as a write driver or a sense amplifier circuit. In more detail, during a program operation, the page buffer 135 operates as a write driver to apply a voltage to the bit lines BL for storing the data DATA in the memory cell array 110. On the other hand, in a read operation, the page buffer 135 operates as a sense amplifier to sense the data DATA stored in the memory cell array 110.

Figure 2:
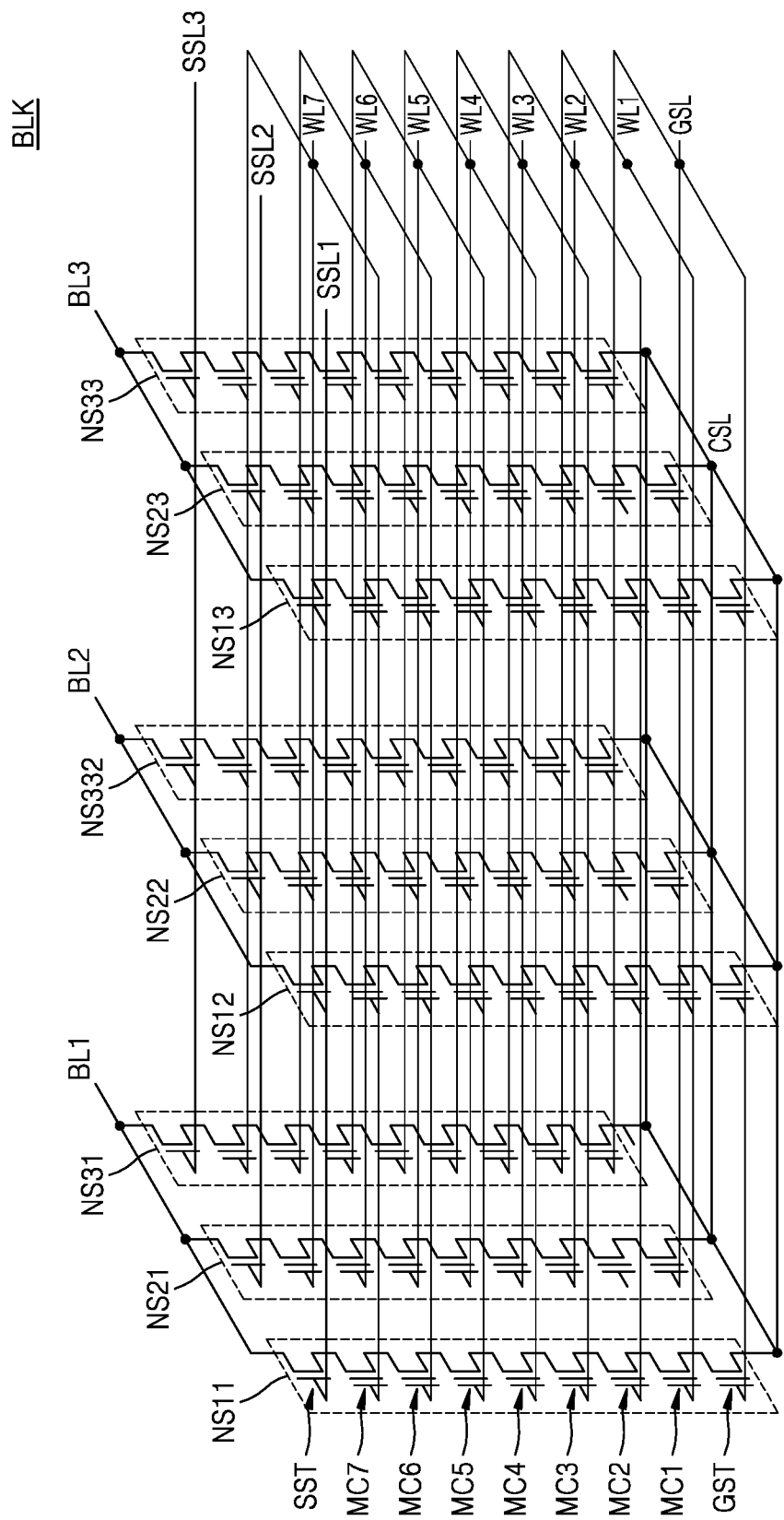
FIG. 2 is a circuit diagram of an equivalent circuit of one memory cell block of a plurality of memory cell blocks in a 3D nonvolatile memory device, according to an embodiment of the inventive concept.

FIG. 2 is a circuit diagram of an equivalent circuit of one memory cell block BLK of the plurality of memory cell blocks in a 3D nonvolatile memory device 100, according to an embodiment of the inventive concept.

Referring to FIG. 2, according to an embodiment, the memory cell block BLK is a vertical NAND flash memory, and each of the plurality of memory cell blocks BLK1 to BLKn shown in FIG. 1 can be implemented as shown in FIG. 2. The memory cell block BLK includes a plurality of NAND strings NS11 to NS33, a plurality of word lines WL1 to WL7, a plurality of bit lines BL1 to BL3, the at least one ground selection line GSL, a plurality of string selection lines SSL1 to SSL3, and a common source line CSL. The number of NAND strings NS11 to NS33, the number of the word lines WL1 to WL7, the number of the bit lines BL1 to BL3, the number of ground selection lines GSL, and the number of the string selection lines SSL1 to SSL3 is not limited to the number shown in the figure and may change according to other embodiments.

According to an embodiment, NAND strings connected in common to one bit line form one column. For example, the NAND strings NS11, NS21, and NS31 connected in common to the first bit line BL1 correspond to a first column, the NAND strings NS12, NS22, and NS32 connected in common to the second bit line BL2 correspond to a second column, and the NAND strings NS13, NS23, and NS33 connected in common to the third bit line BL3 correspond to a third column.

According to an embodiment, NAND strings connected to one string selection line form one row. For example, the NAND strings NS11, NS12, and NS13 connected to the first string selection line SSL1 correspond to a first row, the NAND strings NS21, NS22, and NS23 connected to the second string selection line SSL2 correspond to a second row, and the NAND strings NS31, NS32, AND NS33 connected to the third string selection line SSL3 correspond to a third row.

According to an embodiment, each of the NAND strings NS11 to NS33 include a string selection transistor SST, a plurality of memory cells MC1 to MC7, and a ground selection transistor GST that are connected in series. In addition, in some embodiments, at least one dummy cell is included between the string selection transistor SST and a topmost memory cell, for example, the seventh memory cell MC7, or between the ground selection transistor GST and a bottommost memory cell, for example, the first memory cell MC1.

According to an embodiment, the string selection transistor SST is connected to the corresponding string selection lines SSL1 to SSL3 and the corresponding bit lines BL1 to BL3. The plurality of memory cells MC1 to MC7 are connected to the corresponding word lines WL1 to WL7, respectively. The ground selection transistor GST is connected to the corresponding ground selection line GSL and the common source line CSL.

In FIG. 2, according to an embodiment, the string selection lines SSL1 to SSL3 are separated from each other, the ground selection lines GSL are connected to each other, and the word lines WL1 to WL7 at the same level are connected to each other. However, embodiments of the inventive concept are not limited thereto. For example, in other embodiments, the ground selection lines GSL are separated from each other like the string selection lines SSL1 to SSL3.

Figure 3A:
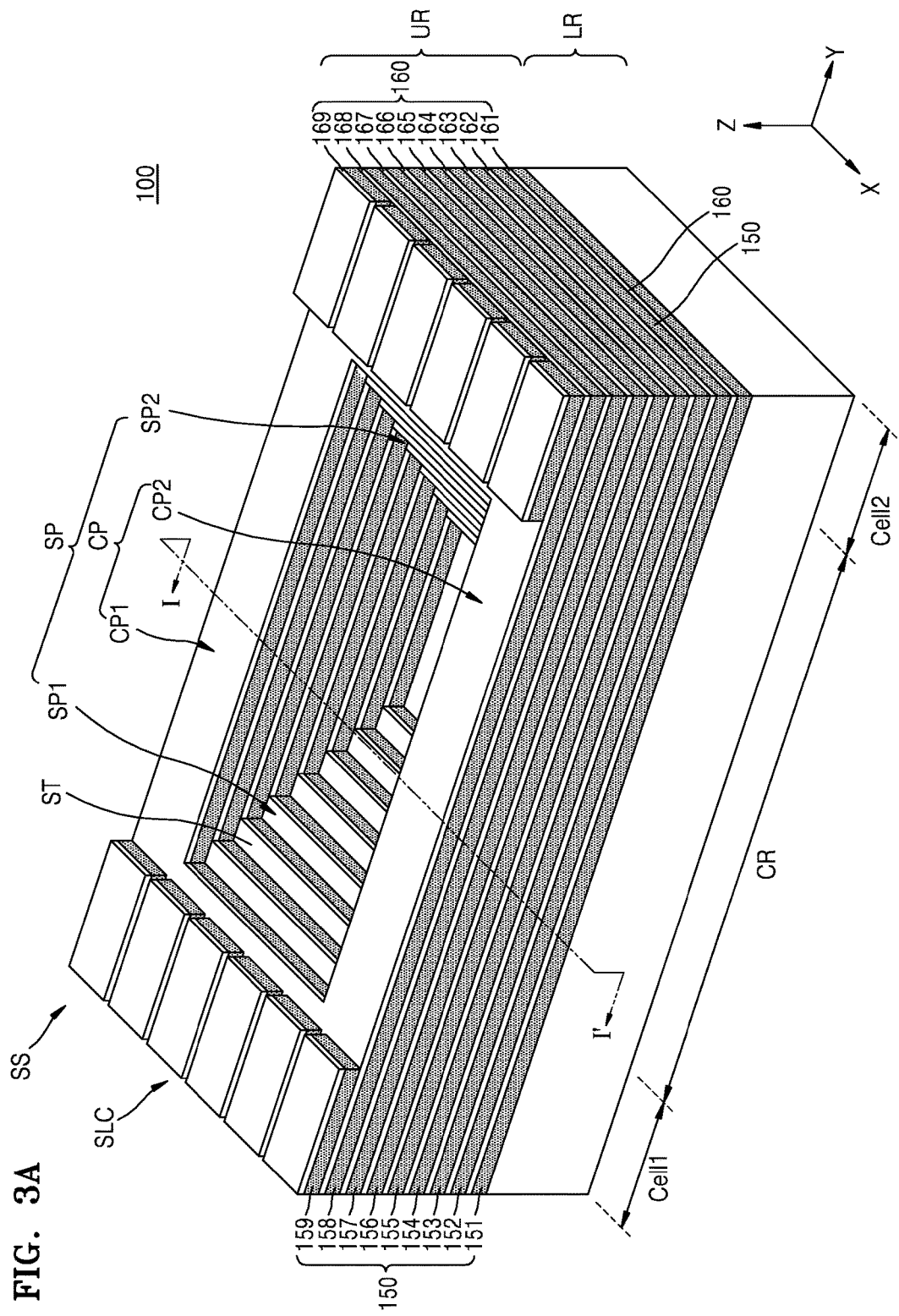
FIG. 3A is a perspective view of a 3D nonvolatile memory device according to an embodiment of the inventive concept.
Figure 3B:
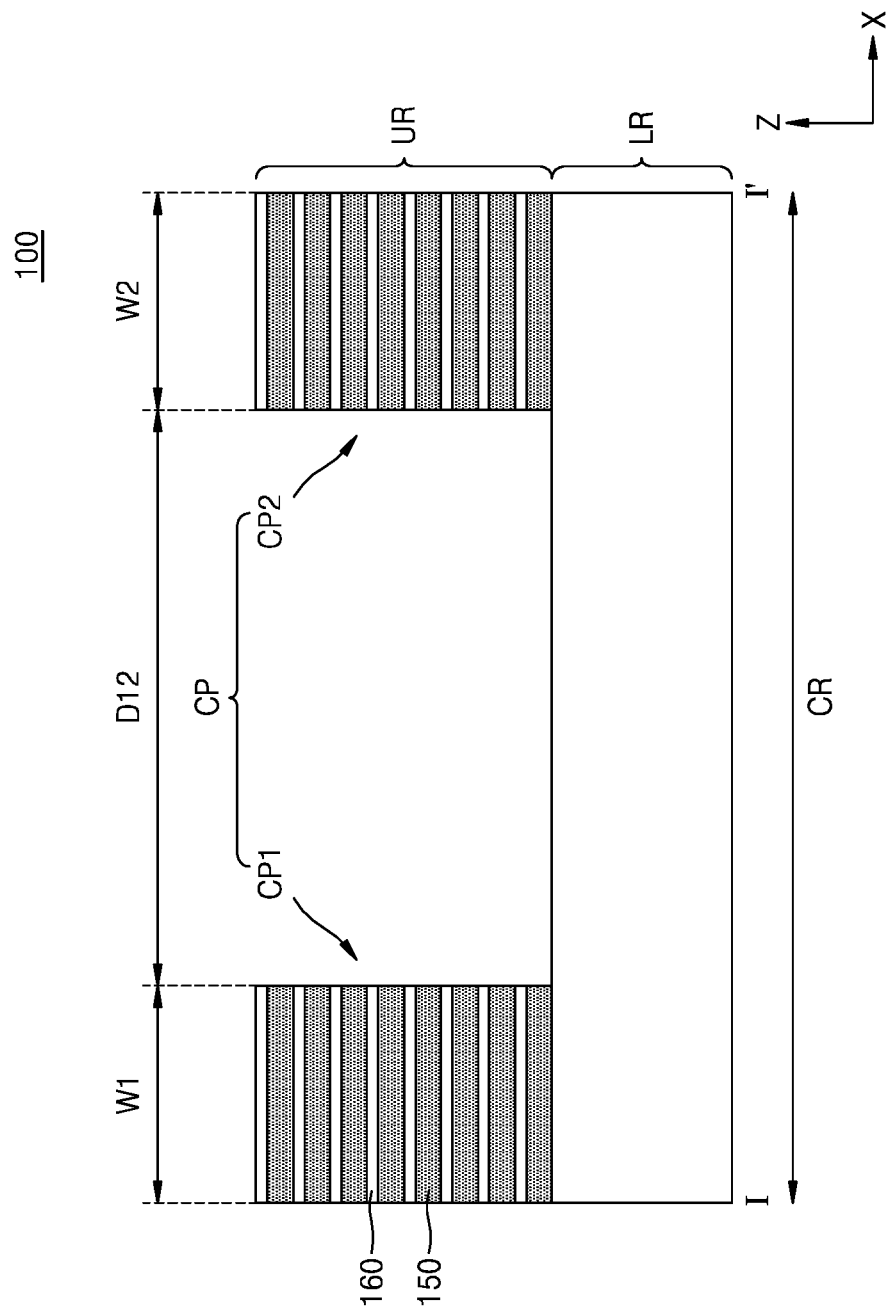
FIG. 3B is a cross-sectional view of a connection portion taken along a line I-I' of FIG. 3A.

FIG. 3A is a perspective view of the 3D nonvolatile memory device 100 according to an embodiment of the inventive concept. FIG. 3B is a cross-sectional view of a connection portion taken along a line I-I' of FIG. 3A. For convenience of explanation, only the connection portion is shown in FIG. 3B.

Referring to FIG. 3A, according to an embodiment, the 3D nonvolatile memory device 100 according to an embodiment of the inventive concept includes a lower region LR and an upper region UR. The peripheral circuit 130 shown in FIG. 1 is located in the lower region LR, and the memory cell array 110 shown in FIG. 1 is located in the upper region UR. That is, the 3D nonvolatile memory device 100 according to an embodiment of the inventive concept is a cell-on-peri or a cell-over-peri (COP) type. Since the peripheral circuit 130 shown in FIG. 1 is under the memory cell array 110, a plane area occupied by the 3D nonvolatile memory device 100 is reduced, and a degree of integration of the 3D nonvolatile memory device 100 is increased.

According to an embodiment, the memory cell array 110 in the upper region UR includes a stacked structure SS. The stacked structure SS includes a plurality of interlayer insulating layers 160 and a plurality of conductive layers 150. For example, the stacked structure SS includes first to ninth insulating layers 161 to 169 and first to ninth conductive layers 151 to 159. Each of the plurality of interlayer insulating layers 160 and the plurality of conductive layers 150 are alternately stacked in one direction, such as a Z direction. For example, the first conductive layer 151, the first interlayer insulating layer 161, the second conductive layer 152, the second interlayer insulating layer 162, the third conductive layer 153, the third interlayer insulating layer 163, etc., are sequentially stacked, starting from the bottom. That is, the plurality of conductive layers 150 are separated from each other by the plurality of interlayer insulating layers 160. Each of the plurality of interlayer insulating layers 160 includes an insulator, such as silicon oxide or a low dielectric (low-k) material. Each of the plurality of conductive layers 150 includes at least one of a metal, such as tungsten (W), aluminum (Al), copper (Cu), or gold (Au), doped silicon, a metal nitride, or a metal silicide.

According to an embodiment, the Z direction is a direction in which the plurality of conductive layers 150 and the plurality of interlayer insulating layers 160 are stacked and points away from the lower region LR. Herein, the fact that two objects or two components are located at the same level means that the Z direction coordinates with respect to an arbitrary origin of the center of each object or the center of each component are equal to each other. Furthermore, the fact that an object or component is at a higher level than the other object or component means that a Z direction coordinate with respect to an arbitrary origin of the object or component is greater than a Z direction coordinate of the other object or component. In addition, the fact that an object or component is at a lower level than the other object or component means that a Z direction coordinate with respect to an arbitrary origin of the object or component is less than a Z direction coordinate of the other object or component.

According to an embodiment, a top portion of the stacked structure SS is divided into a plurality of portions separated from each other by a plurality of string selection line cuts SLC. Therefore, a topmost conductive layer of the plurality of conductive layers 150 in the stacked structure SS, for example, the ninth conductive layer 159, includes the plurality of portions separated from each other by the string selection line cuts SLC.

According to an embodiment, the stacked structure SS includes a first cell region Cell1, a second cell region Cell2, and a connection region CR. The first cell region Cell1 and the second cell region Cell2 are spaced apart from each other. The connection region CR is positioned between the first cell region Cell1 and the second cell region Cell2. The connection region CR includes a first step portion SP1, a second step portion SP2, and a connection portion CP. The first step portion SP1 has a stepped shape in contact with the first cell region Cell1 that descends in a direction approaching the second cell region Cell2, such as a Y-direction. The second step portion SP2 has a stepped shape in contact with the second cell region Cell2 that descends in a direction approaching the first cell region Cell1, such as a negative Y-direction. Each of the first step portion SP1 and the second step portion SP2 includes a plurality of steps ST. At least one of the steps ST of the first step portion SP1 is at the same level as one of the steps ST of the second step portion SP2. For example, as shown in FIG. 3A, the steps ST of the first step portion SP1 are at the same level as corresponding steps ST of the second step portion SP2, respectively. However, embodiments of the inventive concept are not limited thereto. The connection portion CP connects the first cell region Cell1 and the second cell region Cell2. The connection portion CP also contacts the first step portion SP1 and the second step portion SP2. One sidewall of the connection portion CP is aligned with one sidewall of the first cell region Cell1 and one sidewall of the second cell region Cell2, for example, along the YZ-plane.

Referring to FIGS. 3A and 3B, according to an embodiment, the connection portion CP of the stacked structure SS include a first connection portion CP1 and a second connection portion CP2. The first connection portion CP1 and the second connection portion CP2 are spaced apart from each other in a spacing direction, such as an X-direction. A width W1 of the first connection portion CP1 and a width W2 of the second connection portion CP2 in the spacing directions, such as the X-direction, are constant regardless of a height in the Z direction. In addition, a distance D12 in the X-direction between the first connection portion CP1 and the second connection portion CP2 is constant regardless of a vertical position, such as a height in the Z direction.

Figure 4:
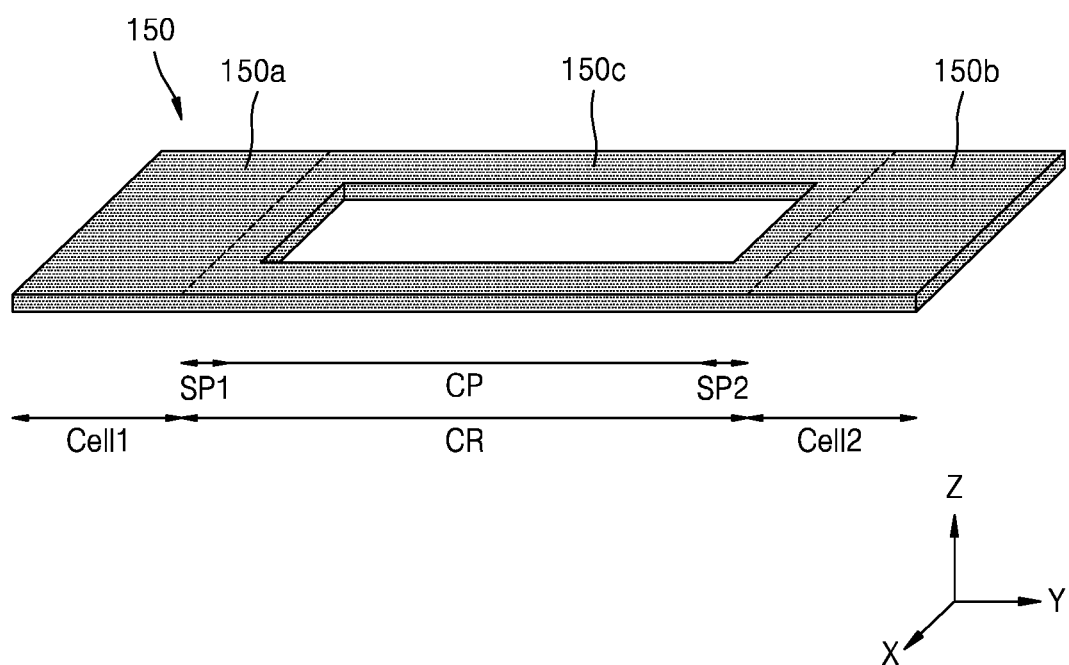
FIG. 4 is a perspective view of one of a plurality of conductive layers shown in FIGS. 3A and 3B.

FIG. 4 is a perspective view of one of the plurality of conductive layers 150 shown in FIGS. 3A and 3B.

Referring to FIGS. 4 and 3A, according to an embodiment, a conductive layer 150 extends over the first cell region Cell1, the first step portion SP1, the connection portion CP, the second step portion SP2, and the second cell region Cell2. The conductive layer 150 includes a first portion 150a in the first cell region Cell1, a second portion 150b in the second cell region Cell2, and a third portion 150c in the connection region CR. The third portion 150c extends over the connection portion CP, the first step portion SP1, and the second step portion SP2. The third portion 150c connects the first portion 150a and the second portion 150b.

Figure 5A:
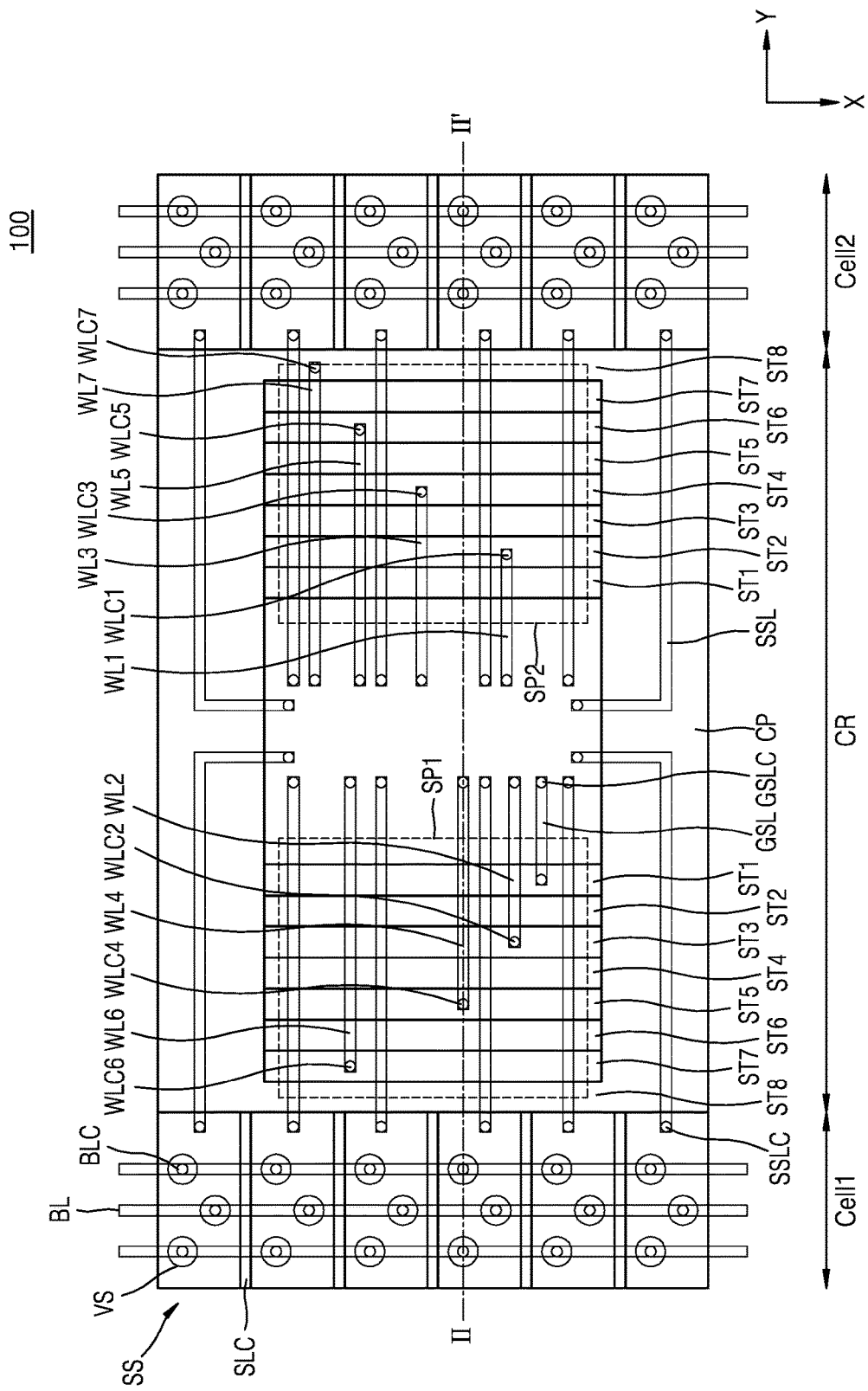
FIG. 5A is a detailed plan view of a 3D nonvolatile memory device shown in FIGS. 3A and 3B.
Figure 5B:
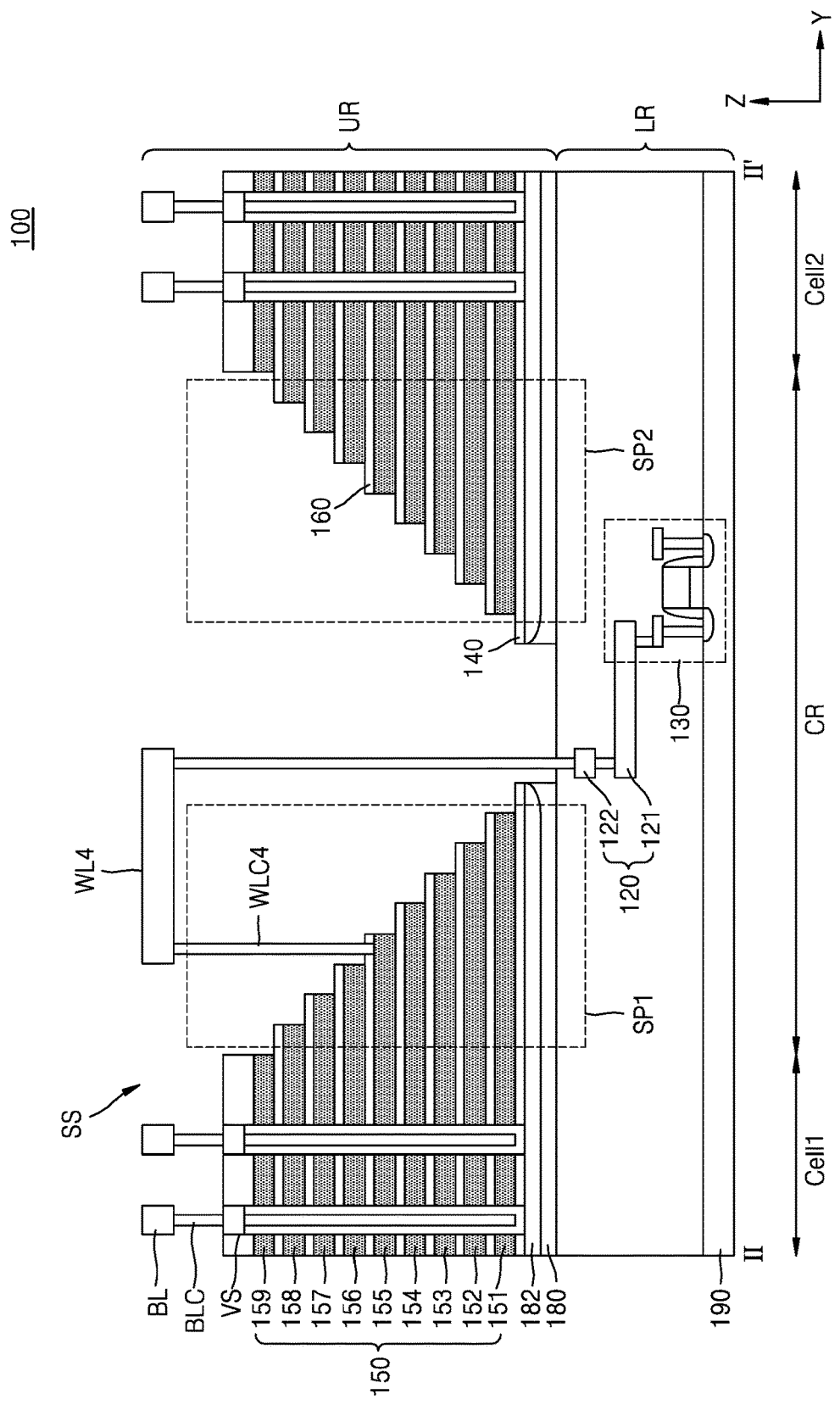
FIG. 5B is a cross-sectional view taken along a line II-II' of FIG. 5A.
Figure 6:
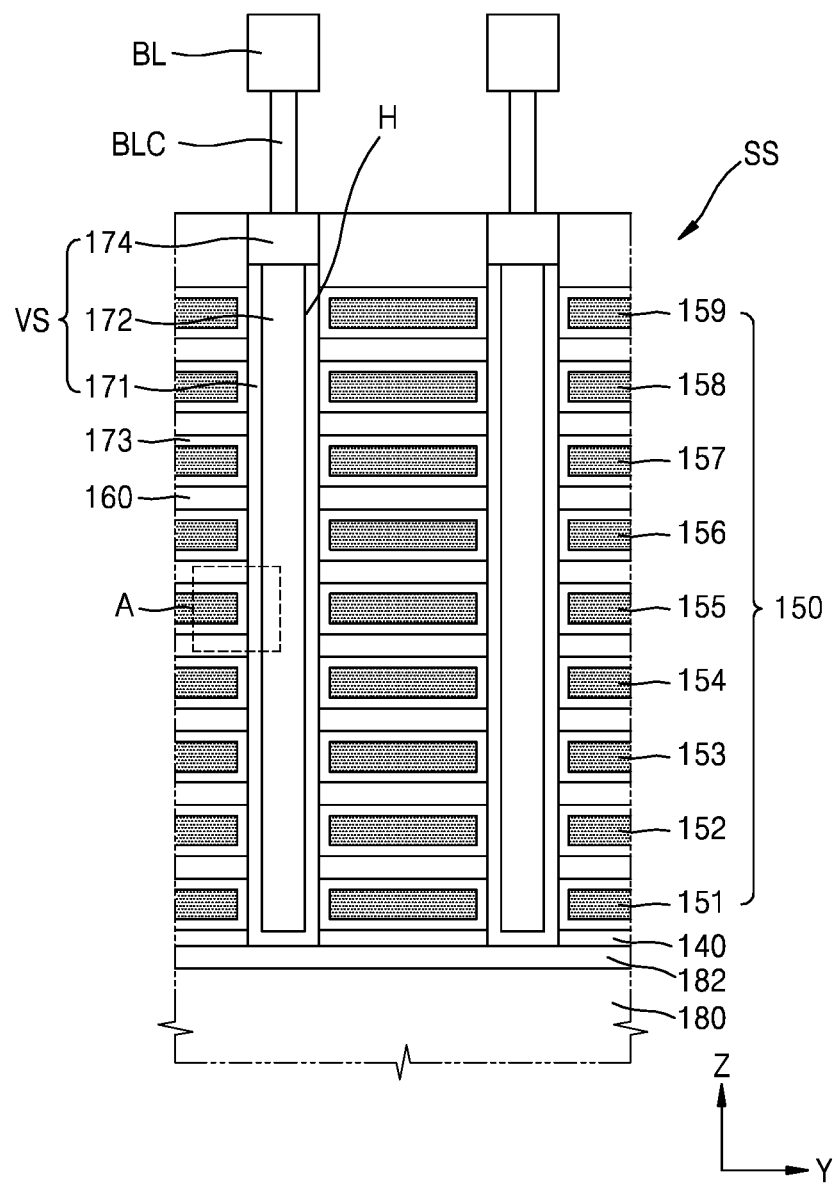
FIG. 6 is a cross-sectional view of a vertical channel structure of FIGS. 5B and 5B.
Figure 7:
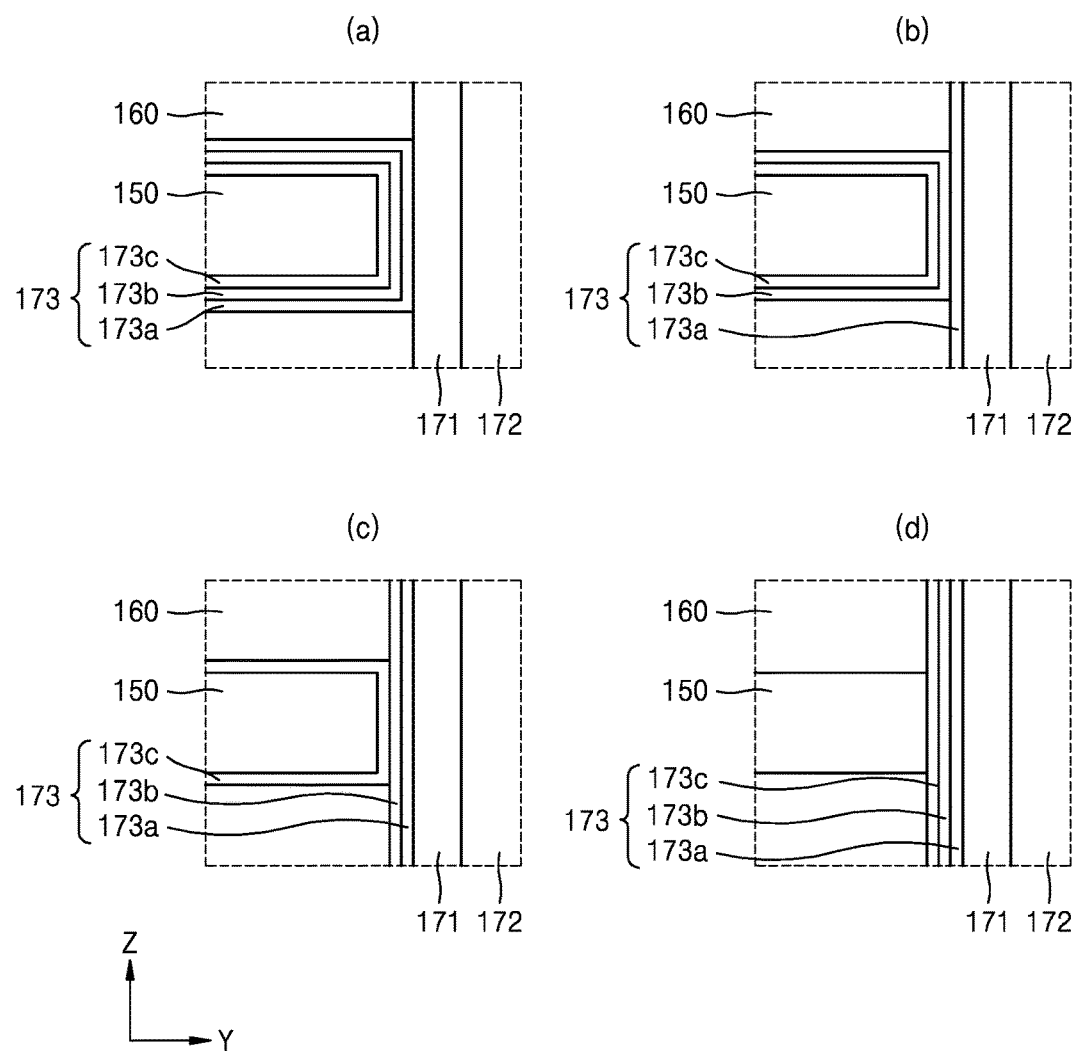
FIG. 7 is an enlarged view of various variations of area A in FIG. 6.

FIG. 5A is a detailed plan view of the 3D nonvolatile memory device 100 shown in FIGS. 3A and 3B. FIG. 5B is a cross-sectional view taken along a line II-II' of FIG. 5A. FIG. 6 is a cross-sectional view of a vertical channel structure of FIGS. 5A and 5B. FIG. 7 is an enlarged view of various variations of area A in FIG. 6.

According to an embodiment, referring first to FIG. 5B, the lower region LR may include a lower substrate 190, the peripheral circuit 130 shown in FIG. 1, and lower conductive lines 120. The lower substrate 190 includes a semiconductor such as single silicon crystal or single germanium crystal and is a bulk wafer or an epitaxial layer. A detailed description of the peripheral circuit 130 is as described above with reference to FIG. 1. FIG. 5B illustratively shows one of the transistors of the row decoder 133 of the peripheral circuit 130 shown in FIG. 1. Each of the lower conductive lines 120 includes a semiconductor such as silicon. The material of each of the lower conductive lines 120 has higher resistivity than a metal, such as W, Al, or Cu. The lower conductive lines 120 include lines at multiple levels. For example, as shown in FIG. 5B, the lower conductive lines 120 includes a first lower conductive line 121 and a second lower conductive line 122. However, the number of layers of a lower conductive line 120 is not limited thereto, and may vary in other embodiments.

According to an embodiment, the upper region UR includes an upper substrate 180, a buffer insulating layer 140, the stacked structure SS shown in FIG. 3A, and a vertical channel structure VS. The upper substrate 180 includes a semiconductor such as polysilicon. The upper substrate 180 may include an n-type or p-type doped well region 182. The buffer insulating layer 140 is disposed between the stacked structure SS and the upper substrate 180. The buffer insulating layer 140 includes an insulator such as a silicon oxide. Although FIG. 5B shows two upper substrates 180 separated from each other under one stacked structure SS, in some embodiments, one integrated upper substrate 180 is disposed under the one stacked structure SS. The vertical channel structure VS is disposed in the first cell region Cell1 and the second cell region Cell2 of the stacked structure SS.

Referring to FIG. 6, according to an embodiment, the vertical channel structure VS extends in a direction perpendicular to the upper substrate 180, such as the Z direction. The vertical channel structure VS penetrates the stacked structure SS of the plurality of conductive layers 150 and the plurality of interlayer insulating layers 160. The vertical channel structure VS also penetrates the buffer insulating layer 140 and contacts the well region 182 of the upper substrate 180.

According to an embodiment, the vertical channel structure VS includes a channel pattern 171, a gap-fill insulating pattern 172, and a pad pattern 174. The channel pattern 171 extends in a direction perpendicular to the upper substrate 180, such as the Z direction. The channel pattern 171 has a hollow cylinder shape with a closed bottom. The channel pattern 171 includes a semiconductor such as silicon, germanium, or silicon-germanium. An inner wall surface of the channel pattern 171, that is, a hollow H surrounded by the channel pattern 171 is filled with the gap-fill insulating pattern 172. The gap-fill insulating pattern 172 includes an insulator such as a silicon oxide. In other embodiments, unlike FIG. 6, the channel pattern 171 has a cylinder or a circular column shape. In this case, since no hollow H is formed by the channel pattern 171, the vertical channel structure VS does not include the gap-fill insulating pattern 172. The pad pattern 174 covers an upper end of the gap-fill insulating pattern 172 and an upper end of the channel pattern 171. The pad pattern 174 includes a semiconductor such as silicon, germanium, or silicon-germanium. The pad pattern 174 is connected to a bit line contact BLC for connecting the vertical channel structure VS to a bit line BL.

According to an embodiment, an information storage layer 173 is disposed between the channel pattern 171 of the vertical channel structure VS and the respective conductive layers 150 of the stacked structure SS. The information storage layer 173 extends not only between the conductive layers 150 and the channel pattern 171 but also between the conductive layers 150 and the interlayer insulating layers 160. Referring to section (a) of FIG. 7, which shows the information storage layer 173 in more detail, the information storage layer 173 includes a blocking insulating layer 173c, a charge storage layer 173b, and a tunnel insulating layer 173a. The blocking insulating layer 173c is adjacent to the conductive layers 150, the tunnel insulating layer 173a is adjacent to the channel pattern 171, and the charge storage layer 173b is disposed between the blocking insulating layer 173c and the tunnel insulating layer 173a. The blocking insulating layer 173c includes a high dielectric material such as an aluminum oxide or a hafnium oxide. The charge storage layer 173b is of a trap type. For example, the charge storage layer 173b includes a quantum dot or a nanocrystal. Here, the quantum dot or nanocrystal includes fine particles of a conductor. The charge storage layer 173b includes, for example, a silicon nitride. The tunnel insulating layer 173a includes, for example, a silicon oxide.

According to an embodiment, as shown in sections (b) to (d) of FIG. 7, the arrangement and shape of the information storage layer 173 may vary. According to some embodiments, as shown in section (b) of FIG. 7, the tunnel insulating layer 173a extends in a same direction as the channel pattern 171, such as the Z direction, and does not extend between the conductive layer 150 and an interlayer insulating layer 160. According to some embodiments, as shown in section (c) of FIG. 7, the tunnel insulating layer 173a and the charge storage layer 173b extend in the same direction as the channel pattern 171, such as the Z direction, and do not extend between the conductive layer 150 and an interlayer insulating layer 160. According to some embodiments, as shown in section (d) of FIG. 7, all layers of the information storage layer 173, that is, the tunnel insulating layer 173a, the charge storage layer 173b, and the blocking insulating layer 173c, extend in the same direction as the channel pattern 171, such as the Z direction, and do not extend between the conductive layer 150 and an interlayer insulating layer 160.

Referring to FIGS. 6 and 2, according to an embodiment, one vertical channel structure VS, the plurality of conductive layers 150, and a plurality of information storage layers 173 form one of the plurality of NAND strings NS11 to NS33. That is, one of the plurality of conductive layers 150, one vertical channel structure VS, and one of the information storage layers 173 forms one transistor. For example, the first conductive layer 151 may correspond to a gate electrode of the ground selection transistor GST. The second to eighth conductive layers 152 to 158 may correspond to gate electrodes of the first to seventh memory cells MC1 to MC7, respectively. The ninth conductive layer 159 may correspond to a gate electrode of the string selection transistor SST. A drain region of each of the plurality of NAND strings NS11 to NS33 may be formed in the pad pattern 174 of the vertical channel structure VS and a common source region for the plurality of NAND strings NS11 to NS33 may be formed in the upper substrate 180. FIG. 6 shows that the stacked structure SS includes the first to ninth conductive layers 151 to 159. However, embodiments are not limited thereto and the number of conductive layers 150 of the stacked structure SS may vary depending on the number of ground selection transistors GST, the number of memory cells MC1 to MC7, the number of string selection transistors SST, and the number of dummy cells that are included in each of the plurality of NAND strings NS11 to NS33.

According to an embodiment, FIGS. 5A and 5B show connections between the stacked structure SS and upper conductive lines. The term "upper conductive line" collectively refers to conductive lines located at a higher level than the stacked structure SS. Thus, the upper conductive lines includes the bit lines BL, the string selection lines SSL, the ground selection line GSL, and the word lines WL1 to WL7. Each of the bit lines BL, the string selection lines SSL, the ground selection line GSL, the word lines WL1 to WL7, bit line contacts BLC, string selection line contacts SSLC, a ground selection line contact GSLC, and word-line contacts WLC1 to WLC7 include a metal such as W, Al, or Cu. When the upper conductive lines including a metal, a resistance of the upper conductive lines is less than a resistance of the lower conductive lines 120, which include a semiconductor such as silicon. The upper conductive lines are located at one level, and FIG. 5B shows that the bit line BL and the fourth word line WL4 are located at identical same level. However, in other embodiments, unlike FIG. 5B, the upper conductive lines include conductive lines at different levels.

According to an embodiment, each of the bit lines BL extends in one direction, such as the X-direction. The bit lines BL are connected to the vertical channel structures VS of the first cell region Cell1 and the second cell region Cell2 through the bit line contacts BLC, respectively.

According to an embodiment, the string selection lines SSL are connected to an uppermost layer of the plurality of conductive layers 151 to 159 of the stacked structure SS, such as the ninth conductive layer 159, through the string selection line contacts SSLC.

According to an embodiment, the ground selection line GSL is connected to a lowermost layer of the plurality of conductive layers 151 to 159 of the stacked structure SS, such as the first conductive layer 151, through a ground selection line GSLC. The ground selection line contact GSLC is either a lowest step ST1 of the first step portion SP1 or a lowest step ST1 of the second step portion SP2. For example, in FIG. 5A, the ground selection line contact GSLC is at the lowest step ST1 of the first step portion SP1.

According to an embodiment, the word lines WL1 to WL7 are connected to the remaining layers, such as the second to eighth conductive layers 152 to 158, through the word-line contacts WLC1 to WLC7. For example, the fourth word line WL4 is connected to the fifth conductive layer 155. The word-line contacts WLC1 to WLC7 are the first step portion SP1 and the second step portion SP2. For example, the word-line contact WLC1 connected to the first word line WL1 is either a second lowest step ST2 of the first step portion SP11 or a second lowest step ST2 of the second step portion SP2. The word-line contact WLC2 connected to the second word line WL2 is either a third lower level step ST3 of the first step portion SP1 or a third lower level step ST3 of the second step portion SP2. FIG. 5A shows that the word-line contacts WLC1 to WLC7 are alternately arranged in the second step portion SP2 and the first step portion SP1. That is, word-line contact WLC1 connected to the first word line WL1, word-line contact WLC3 connected to the third word line WL3, word-line contact WLC5 connected to the fifth word line WL5, and word-line contact WLC7 connected to the seventh word line WL7 are located in the second step portion SP2, and word-line contact WLC2 connected to the second word line WL2, word-line contact WLC4 connected to the fourth word line WL4, and word-line contact WLC6 connected to the sixth word line WL6 are located in the first step portion SP1. However, embodiments of the inventive concept are not limited thereto, and the arrangement of the word-line contacts WLC1 to WLC7 may vary in other embodiments.

According to an embodiment, the bit lines BL, the word lines WL1 to WL7, the string selection lines SSL, and the ground selection line GSL are connected to the peripheral circuit 130 of the lower region LR through the lower conductive lines 120. In more detail, the bit lines BL are connected to the page buffer 135 of the peripheral circuit 130 shown in FIG. 1, and the string selection lines SSL and the ground selection line GSL are connected to the row decoder 133 of the peripheral circuit 130. FIG. 5B illustratively shows that the fourth word line WL4 is connected to a transistor of the row decoder 133 of the peripheral circuit 130.

According to the 3D nonvolatile memory device 100 according to an embodiment of the inventive concept, the conductive layers 150 in the stacked structure SS extend from the first cell region Cell1 to the second cell region Cell2 through the connection region CR. As a result, an identical voltage can be applied to the first portion 150a shown in FIG. 4 in the first cell region Cell1 of the conductive layer 150 and the second portion 150b shown in FIG. 4 in the second cell region Cell2 of the conductive layer 150 without additionally using the lower conductive lines 120. When the lower conductive lines 120 include silicon, which has a higher resistivity than metal, and are included in the 3D nonvolatile memory device 100, RC delay of the 3D nonvolatile memory device 100 can increase. However, according to the 3D nonvolatile memory device 100 according to an embodiment of the inventive concept, an increase in the RC delay can be suppressed because no additional lower conductive lines 120 that connect the first portion 150a and the second portion 150b of the conductive layer 150 are needed. In addition, the space occupied by wirings that transmit voltages to the conductive layers 150 can be reduced.

Figure 8:
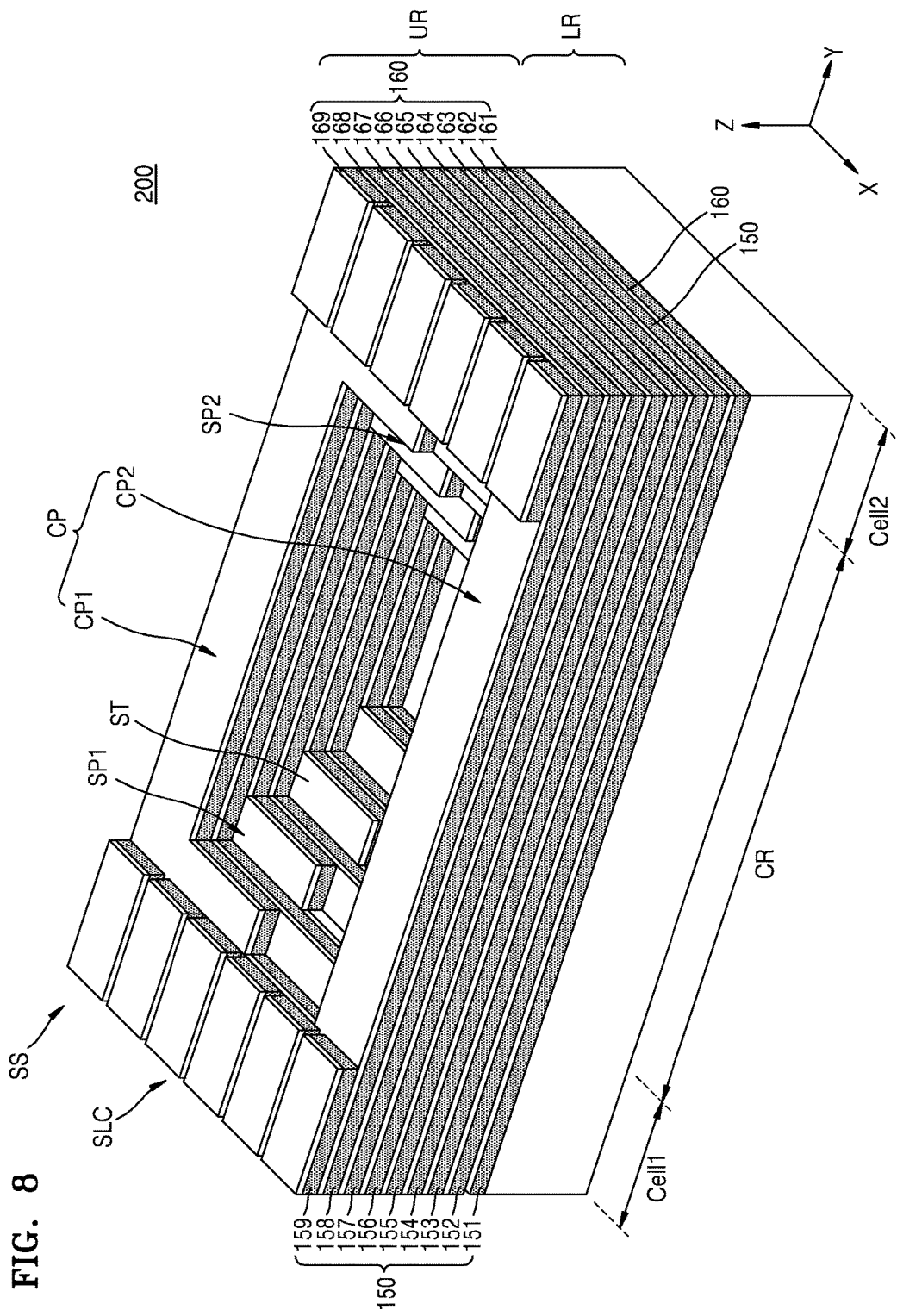
FIG. 8 is a perspective view of a 3D nonvolatile memory device according to an embodiment of the inventive concept.
Figure 9:
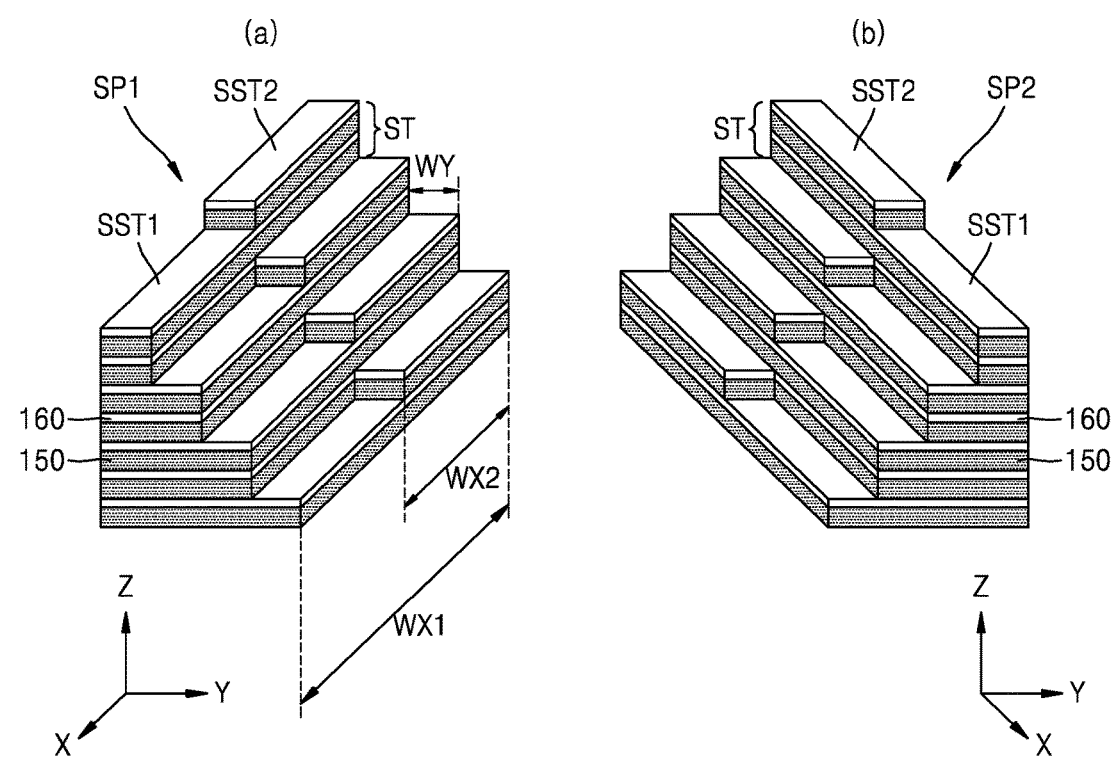
FIG. 9 is a perspective view of a first step portion and a second step portion shown in FIG. 8.

FIG. 8 is a perspective view of a 3D nonvolatile memory device 200 according to an embodiment of the inventive concept. FIG. 9 is a perspective view of the first step portion SP1 and the second step portion SP2 shown in FIG. 8. Hereinafter, the 3D nonvolatile memory device 200 according to a present embodiment will be described by focusing on differences from an embodiment of FIG. 3A.

Referring to FIGS. 8 and 9, according to an embodiment, at least one of the first step portion SP1 and the second step portion SP2 of the 3D nonvolatile memory device 200 according to a present embodiment has sub steps SST1 and SST2. FIGS. 8 and 9 shows that each step ST of the first step portion SP1 and the second step portion SP2 has two sub steps SST1 and SST2. However, not all steps ST need to have the sub steps SST1 and SST2, and the number of sub steps forming one step ST is not limited to two. A width in one direction of the first sub step SST1 and a width in the same direction of the second sub step SST2 differ from each other. For example, a width WX1 in an X-direction of the first sub step SST1 is greater than a width WX2 in the X-direction of the second sub step SST2. A width in another direction of the first sub step SST1 and a width in the same direction of the second sub step SST2 are equal to each other. For example, a width in a Y-direction of the first sub step SST1 and a width in the Y-direction of the second sub step SST2 are equal to WY. The word-line contacts WLC1 to WLC7 shown in FIG. 5A that connect the conductive layers 150 to the word lines WL1 to WL7 shown in FIG. 5A are located in the sub step SST1 and SST2. A sufficient space for the word-line contacts WLC1 to WLC7 is ensured due to the sub-step structure of the step ST. In addition, a plane area of the connection region CR is reduced, and the overall size of the 3D nonvolatile memory device 200 is reduced.

Figure 10A:
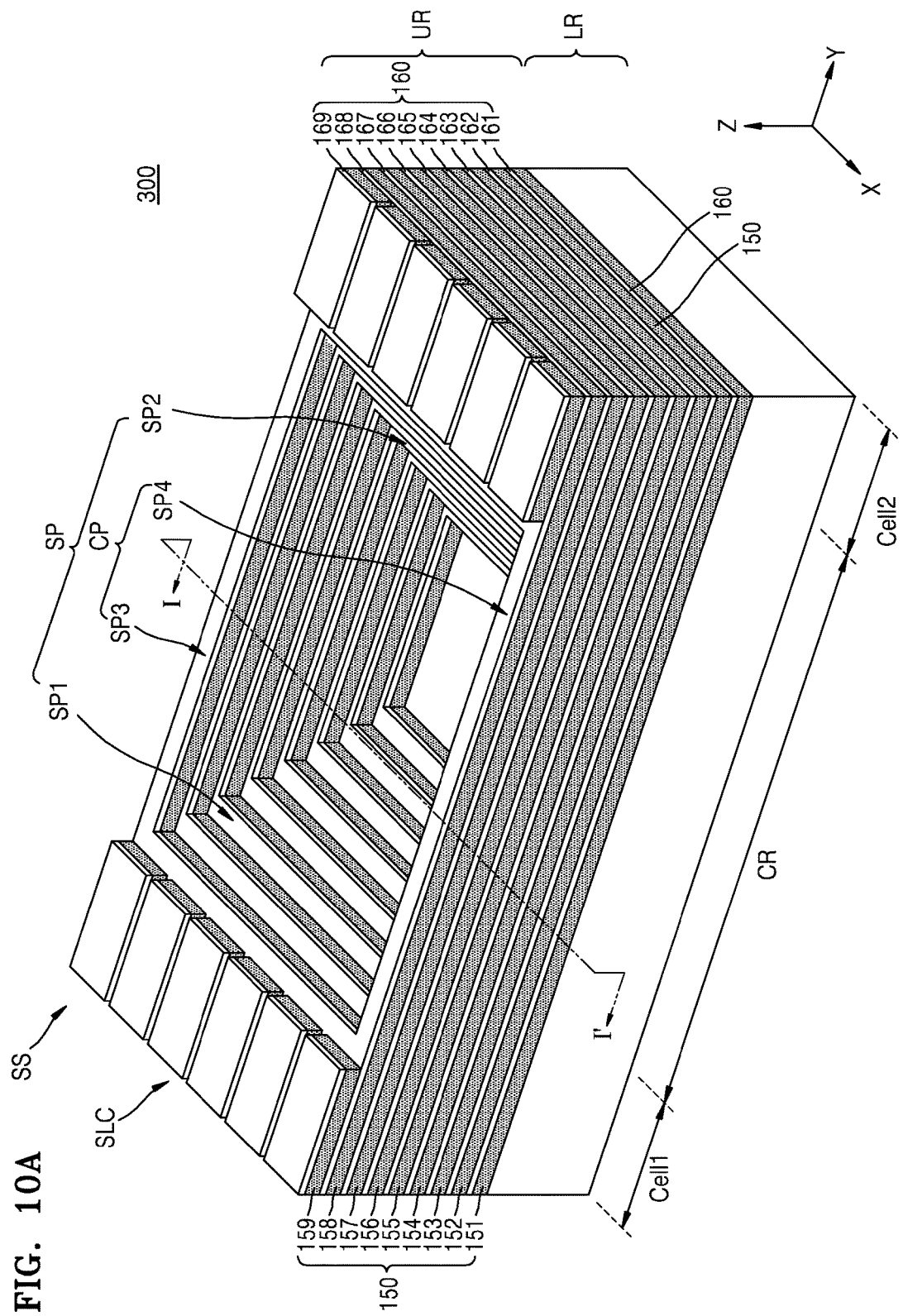
FIGS. 10A and 10B respectively are a perspective view and a plan view of a 3D nonvolatile memory device according to an embodiment of the inventive concept.
Figure 10B:
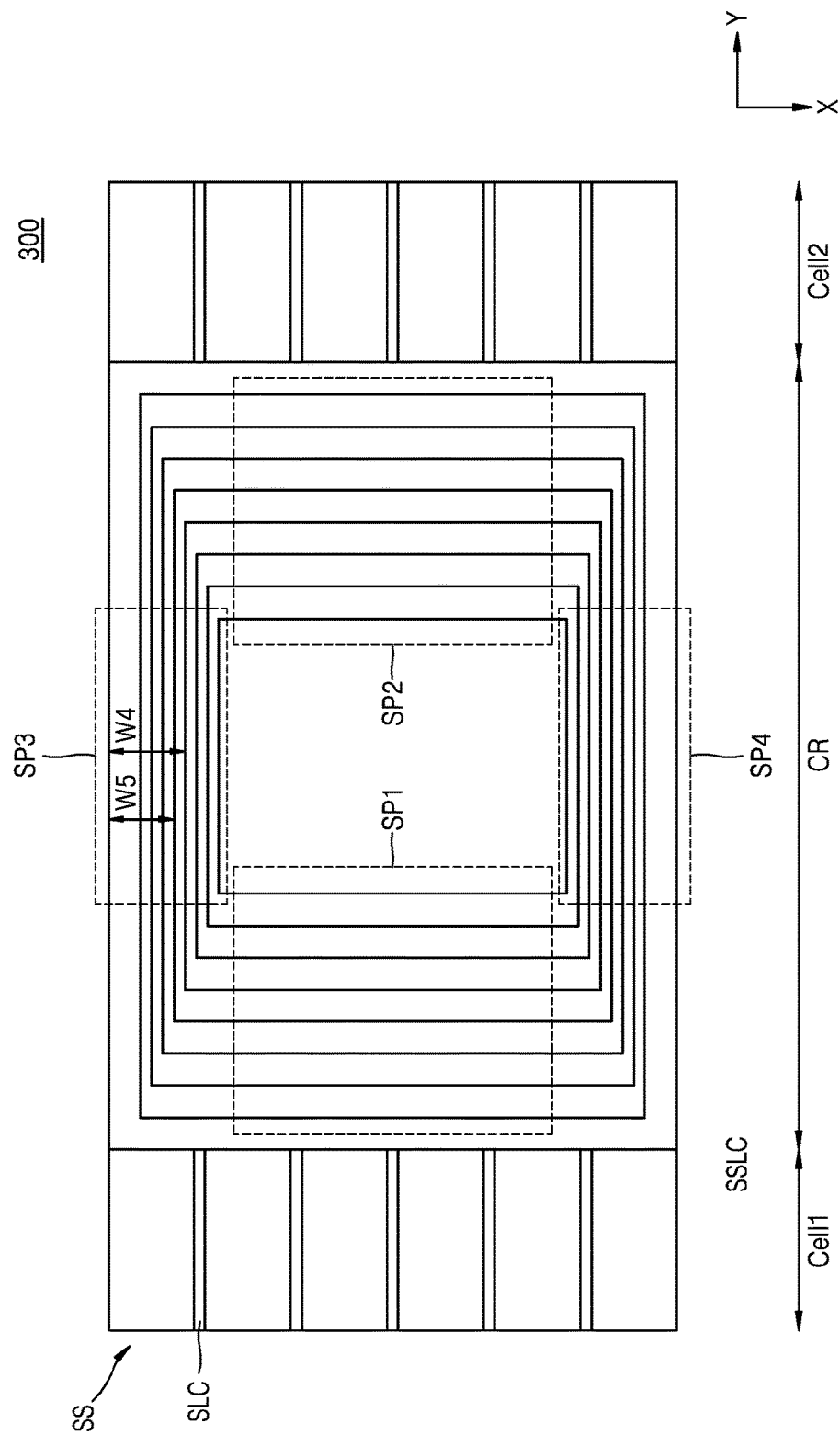
Figure 10C:
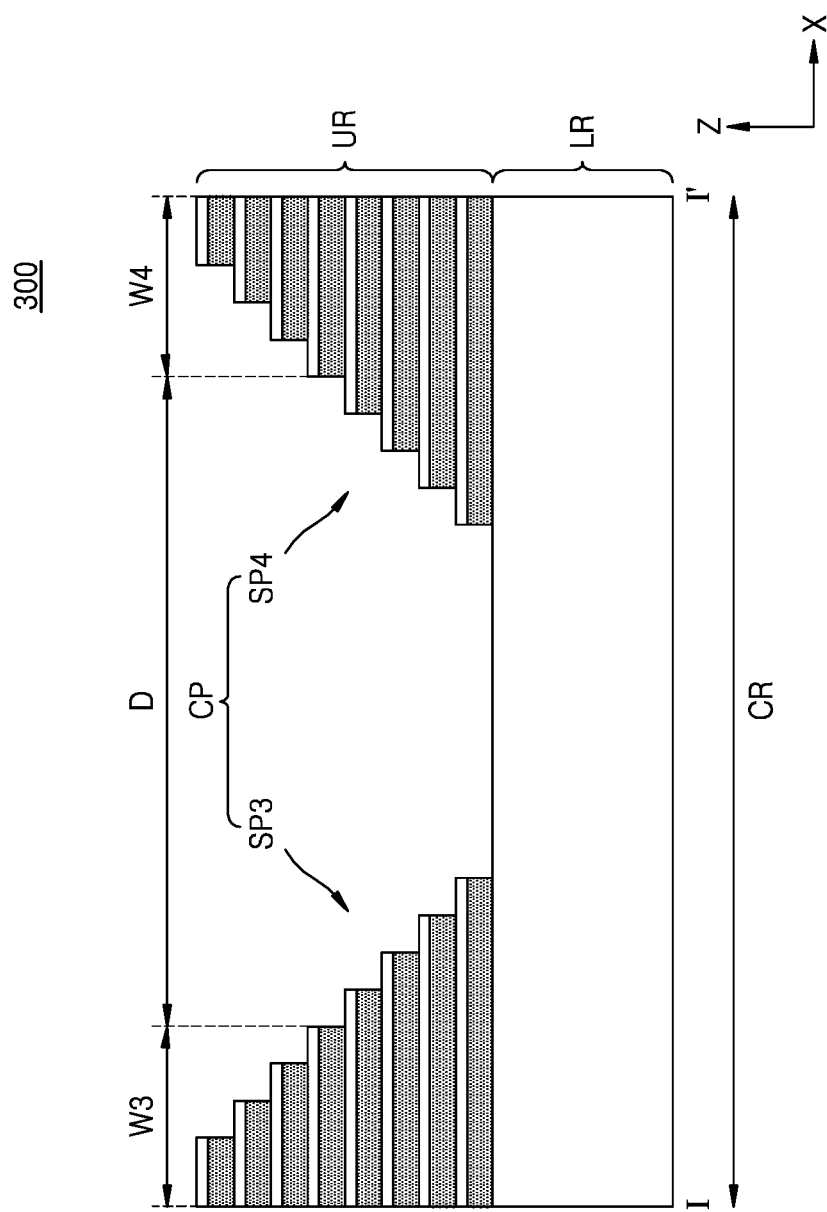
FIG. 10C is a cross-sectional view of a connection portion of FIG. 10A taken along a line I-I'.
Figure 11A:
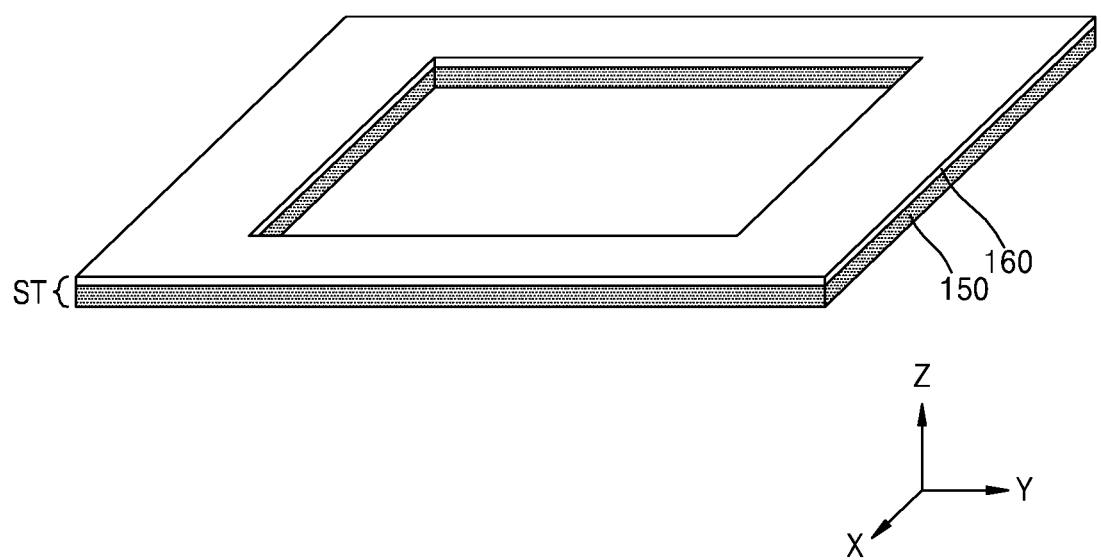
FIG. 11A is a perspective view of one of the steps of FIG. 10A.
Figure 11B:
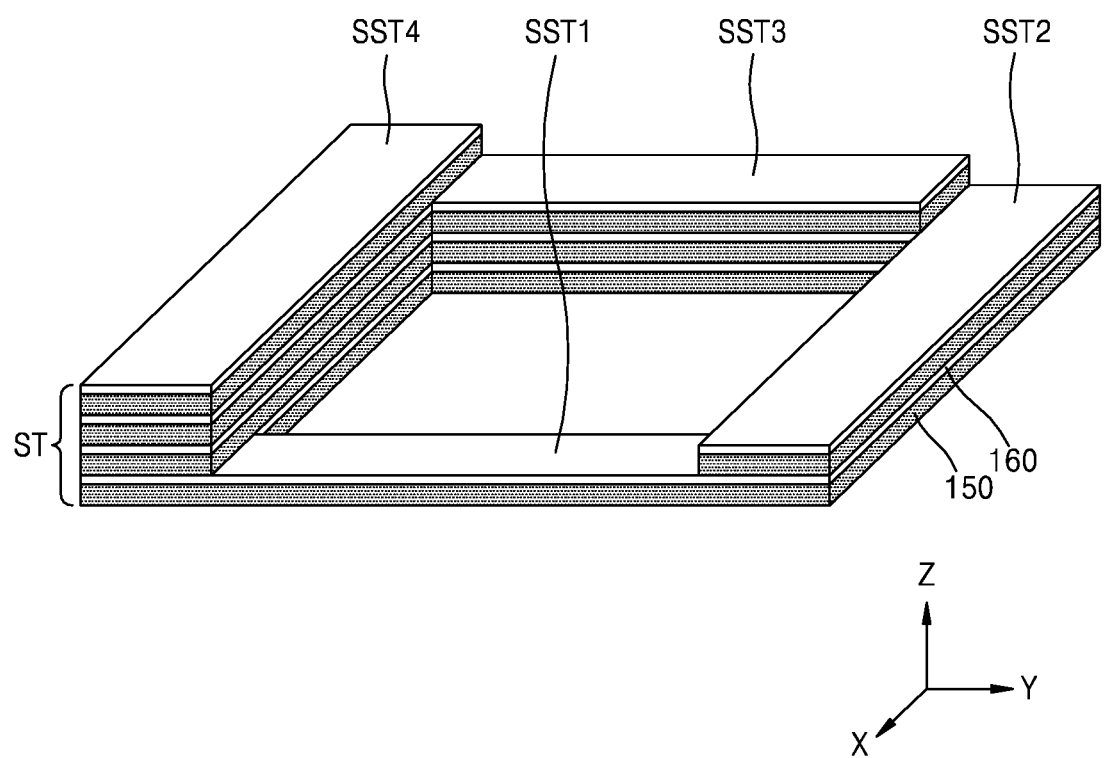
FIG. 11B is a perspective view of a variation of a step of FIG. 11A.

FIGS. 10A and 10B respectively are a perspective view and a plan view of a 3D nonvolatile memory device 300 according to an embodiment of the inventive concept. FIG. 10C is a cross-sectional view of a connection portion of FIG. 10A taken along a line I-I'. FIG. 11A is a perspective view of one of steps of a step portion of FIG. 10A. FIG. 11B is a perspective view of a variation of the step of FIG. 11A. Hereinafter, the 3D nonvolatile memory device 300 according to a present embodiment will be described by focusing on differences from an embodiment of FIG. 3A.

Referring to FIGS. 10A to 10C, according to an embodiment, the connection portion CP of the connection region CR of the stacked structure SS includes a third step portion SP3 and a fourth step portion SP4. The third step portion SP3 connects the first step portion SP1 and the second step portion SP2. The fourth step portion SP4 also connects the first step portion SP1 and the second step portion SP2. Each of the third step portion SP3 and the fourth step portion SP4 has a stepped shape that descends in directions toward each other. For example, the third step portion SP3 has a stepped shape that descends in the X-direction, and the fourth step portion SP4 has a stepped shape that descends in a negative X-direction. The third step portion SP3 and the fourth step portion SP4 are spaced apart from each other in the X-direction. As shown in FIG. 10C, a width W3 in the X-direction of the third step portion SP3 and a width W4 in the X-direction of the fourth step portion SP4 increases as the height of the widths W3 and W4 approach the lower region LR. A distance D in the X-direction between the third step portion SP3 and the fourth step portion SP4 decreases as the height of the distance D approaches the lower region LR.

In other words, according to an embodiment, the connection region CR of the stacked structure SS includes a step portion SP that includes the first step portion SP1, the second step portion SP2, the third step portion SP3, and the fourth step portion SP4. The step portion SP has a stepped shape that descends toward a center of the connection region CR from a periphery of the connection region CR.

As shown in FIG. 11A, according to an embodiment, each step ST of the step portion SP of FIG. 10A may have an annular rectangular shape. According to some embodiments, as shown in FIG. 11B, each step ST of the step portion SP of FIG. 10A includes sub steps SST1 to SST4. The number of sub steps is not limited to four and may vary.

Figure 12A:
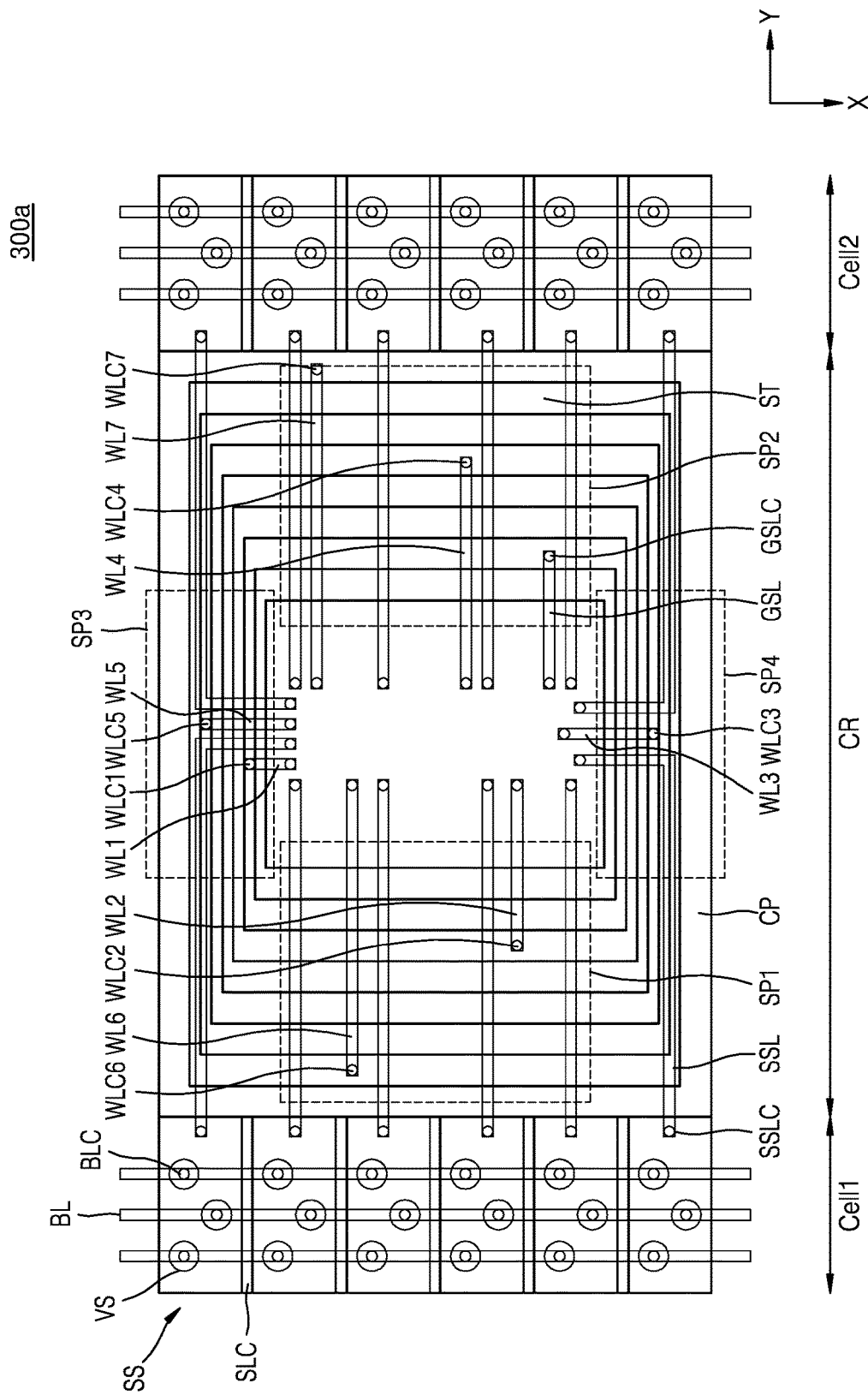
FIGS. 12A and 12B are detailed plan views of a 3D nonvolatile memory device shown in FIGS. 10A to 10C.
Figure 12B:
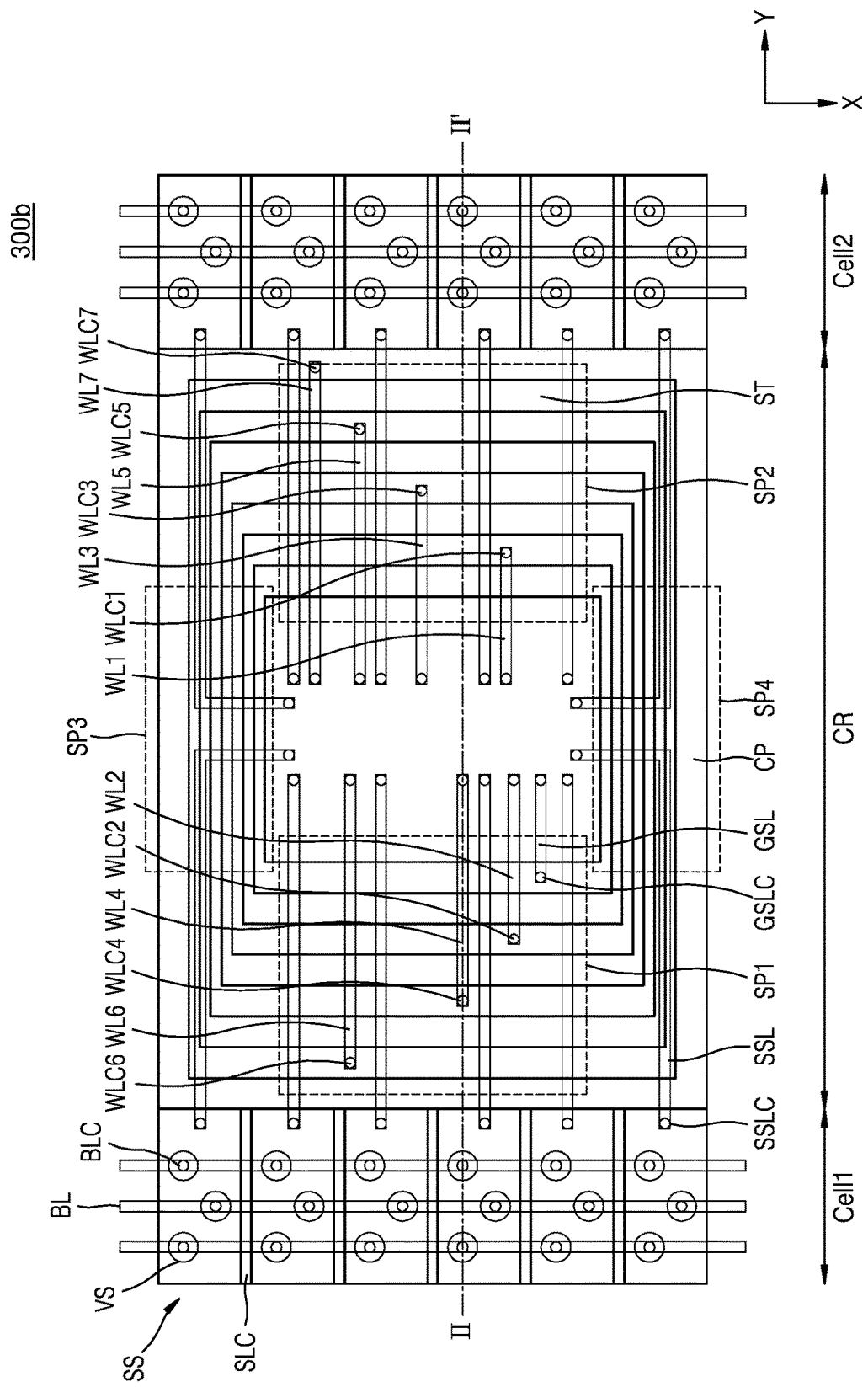

FIGS. 12A and 12B are detailed plan views of the 3D nonvolatile memory device 300 shown in FIGS. 10A to 10C. Hereinafter, embodiments will be described by focusing on differences from an embodiment of FIG. 5A in terms of arrangement of word-line contacts.

Referring to FIG. 12A, according to a present embodiment, the word-line contacts WLC1 to WLC7 are located in the third step portion SP3 and the fourth step portion SP4 as well as the first step portion SP1 and the second step portion SP2. For example, word-line contact WLC2 connected to the second word line WL2 and word-line contact WLC6 connected to the sixth word line WL6 are located in the first step portion SP1, word-line contact WLC4 connected to the fourth word line WL4 and word-line contact WLC7 connected to the seventh word line WL7 are located in the second step portion SP2, word-line contact WLC1 connected to the first word line WL1 and word-line contact WLC5 connected to the fifth word line WL5 are located in the third step portion SP3, and word-line contact WLC3 connected to the third word line WL3 are located in the fourth step portion SP4. According to a 3D nonvolatile memory device 300a according to a present embodiment, sufficient space for the word-line contacts WLC1 to WLC7 is ensured because at least some of the word-line contacts WLC1 to WLC7 are disposed in the third step portion SP3 and the fourth step portion SP4.

According to an embodiment of FIG. 12B, the word-line contacts WLC1 to WLC7 are located in the first step portion SP1 and the second step portion SP2 but not in the third step portion SP3 and the fourth step portion SP4.

Figure 13A:
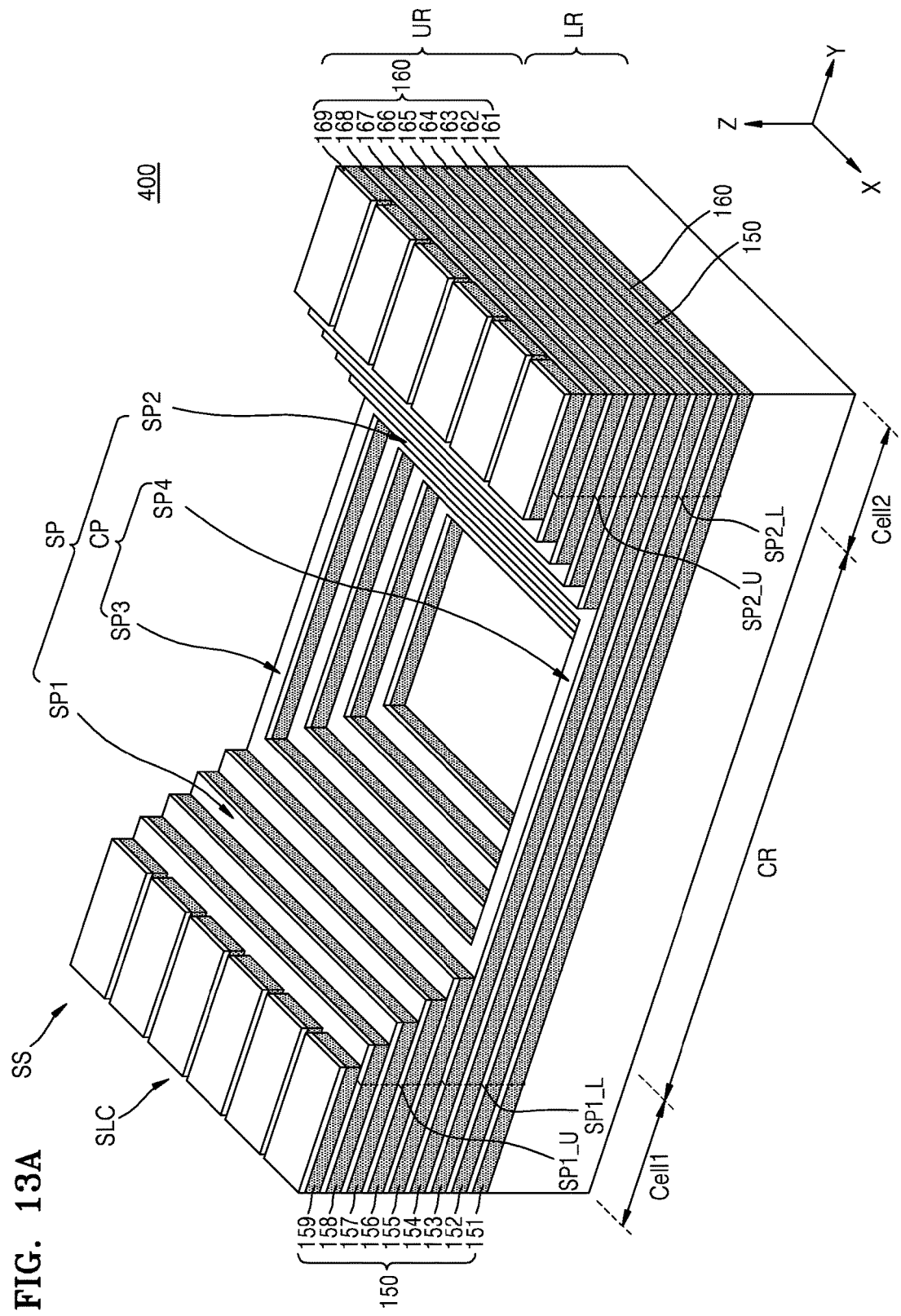

FIGS. 13A and 13B respectively are a perspective view and a plan view of a 3D nonvolatile memory device 400 according to an embodiment of the inventive concept. Hereinafter, a present embodiment will be described by focusing on differences from embodiments of FIGS. 10A to 10C.

Referring to FIGS. 13A and 13B, according to an embodiment, the connection portion CP connects the lower portion SP1_L of the first step portion SP1 and the lower portion SP2_L of the second step portion SP2 but not an upper portion SP1_U of the first step portion SP1 and the upper portion SP2_U of the second step portion SP2.

Figure 14:
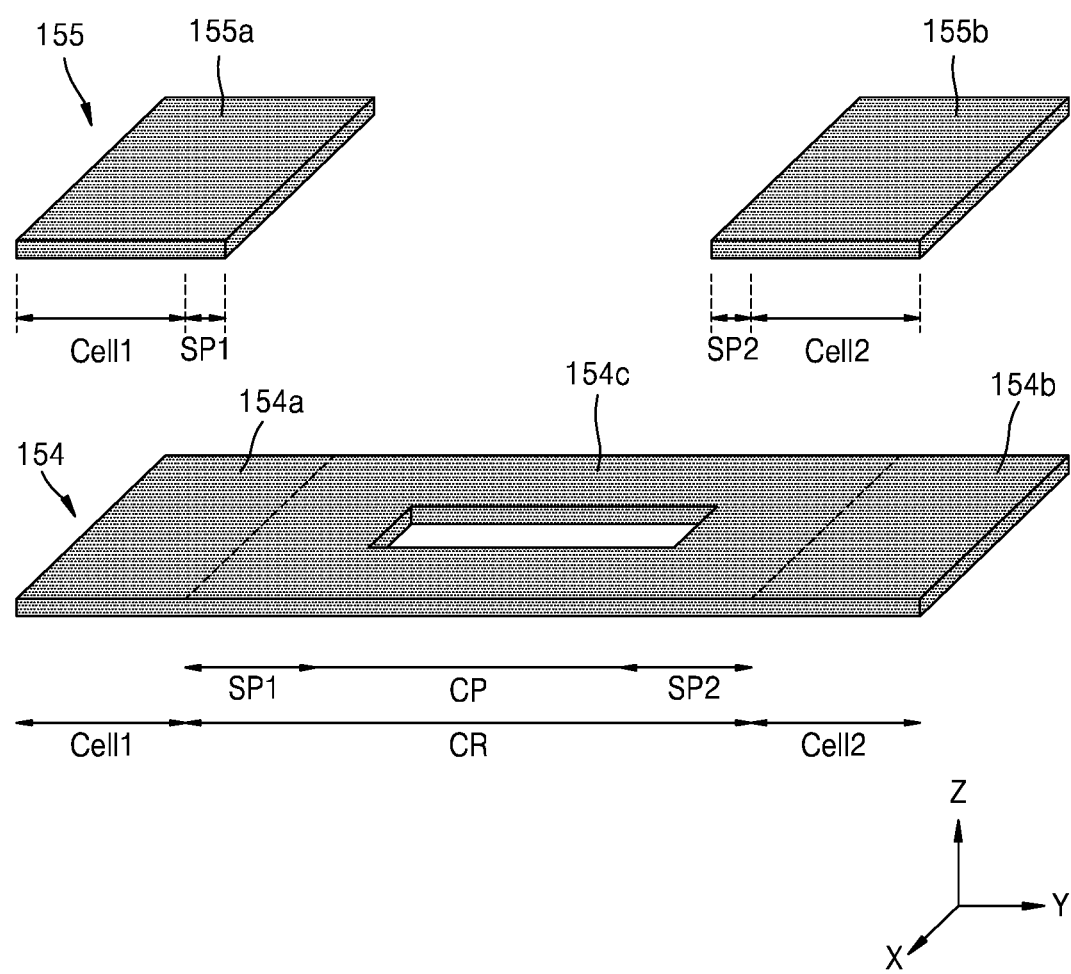
FIG. 14 is a perspective view of two conductive layers of a plurality of conductive layers shown in FIGS. 13A and 13B.

FIG. 14 is a perspective view of two conductive layers of the plurality of conductive layers shown in FIGS. 13A and 13B.

Referring to FIG. 14, according to an embodiment, a layer of the plurality of conductive layers 150 in an upper portion of the stacked structure SS shown in FIG. 13A, such as the fifth conductive layer 155, extends over the first cell region Cell1, a portion of the first step portion SP1, a portion of the second step portion SP2, and the second cell region Cell2. In addition, the fifth conductive layer 155 includes a first portion 155a and a second portion 155b. The first portion 155a of the fifth conductive layer 155 extends over the first cell region Cell1 and the portion of the first step portion SP1. The second portion 155b of the fifth conductive layer 155 extends over the second cell region Cell2 and the portion of the second step portion SP2. In addition, a layer of the plurality of conductive layers 150 in a lower portion of the stacked structure SS shown in FIGS. 13A and 13B, such as the fourth conductive layer 154, extend over the first cell region Cell1, the first step portion SP1, the connection portion CP, the second step portion SP2, and the second cell region Cell2. In addition, the fourth conductive layer 154 includes a first portion 154a in the first cell region Cell1, a second portion 154b in the second cell region Cell2, and a third portion 154c in the connection region CR. The third portion 154c extends over the first step portion SP1, the connection portion CP, and the second step portion SP2. The third portion 154c connects the first portion 154a and the second portion 154b.

Figure 15A:
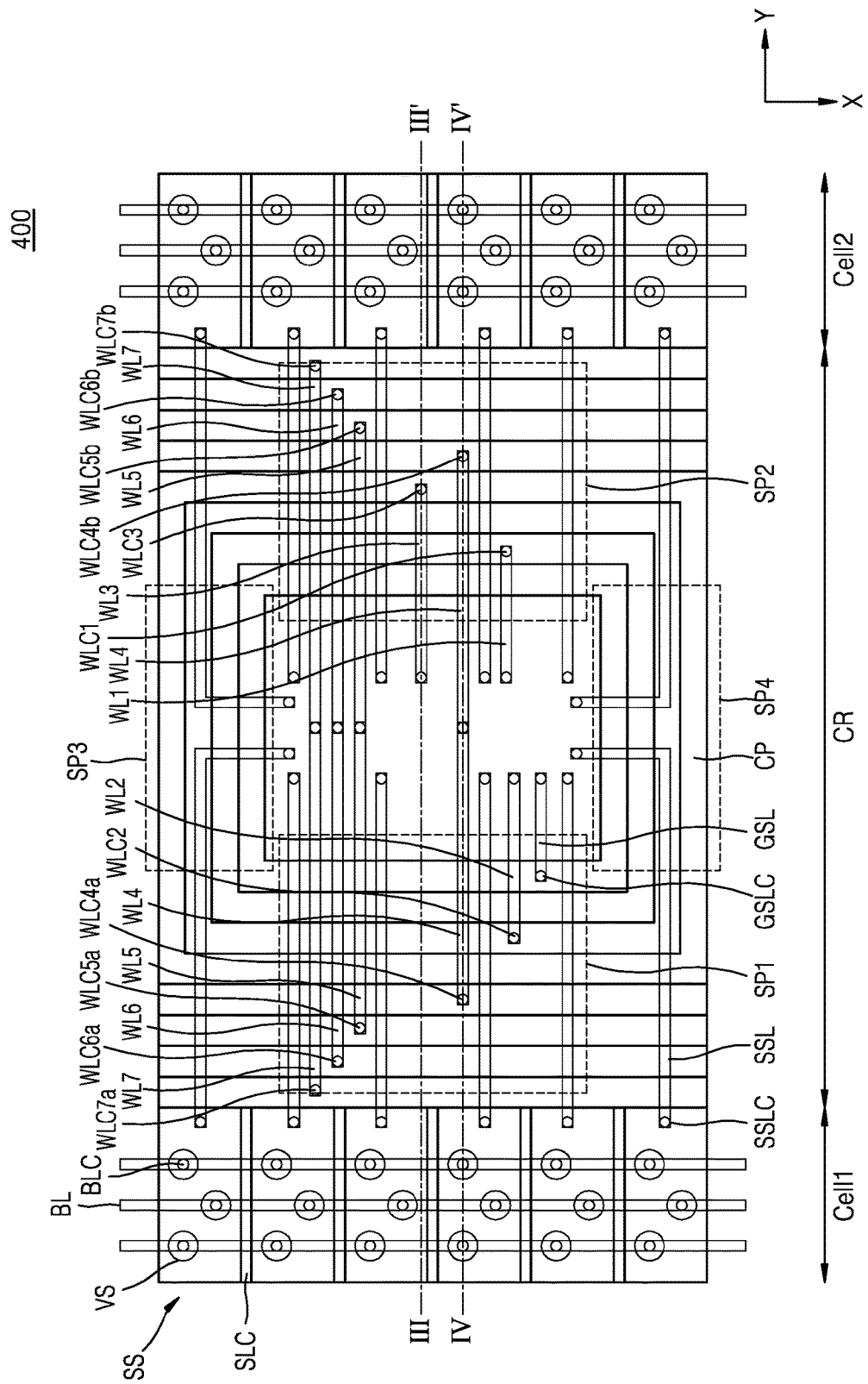
FIG. 15A is a detailed plan view of a 3D nonvolatile memory device shown in FIGS. 13A and 13B.
Figure 15B:
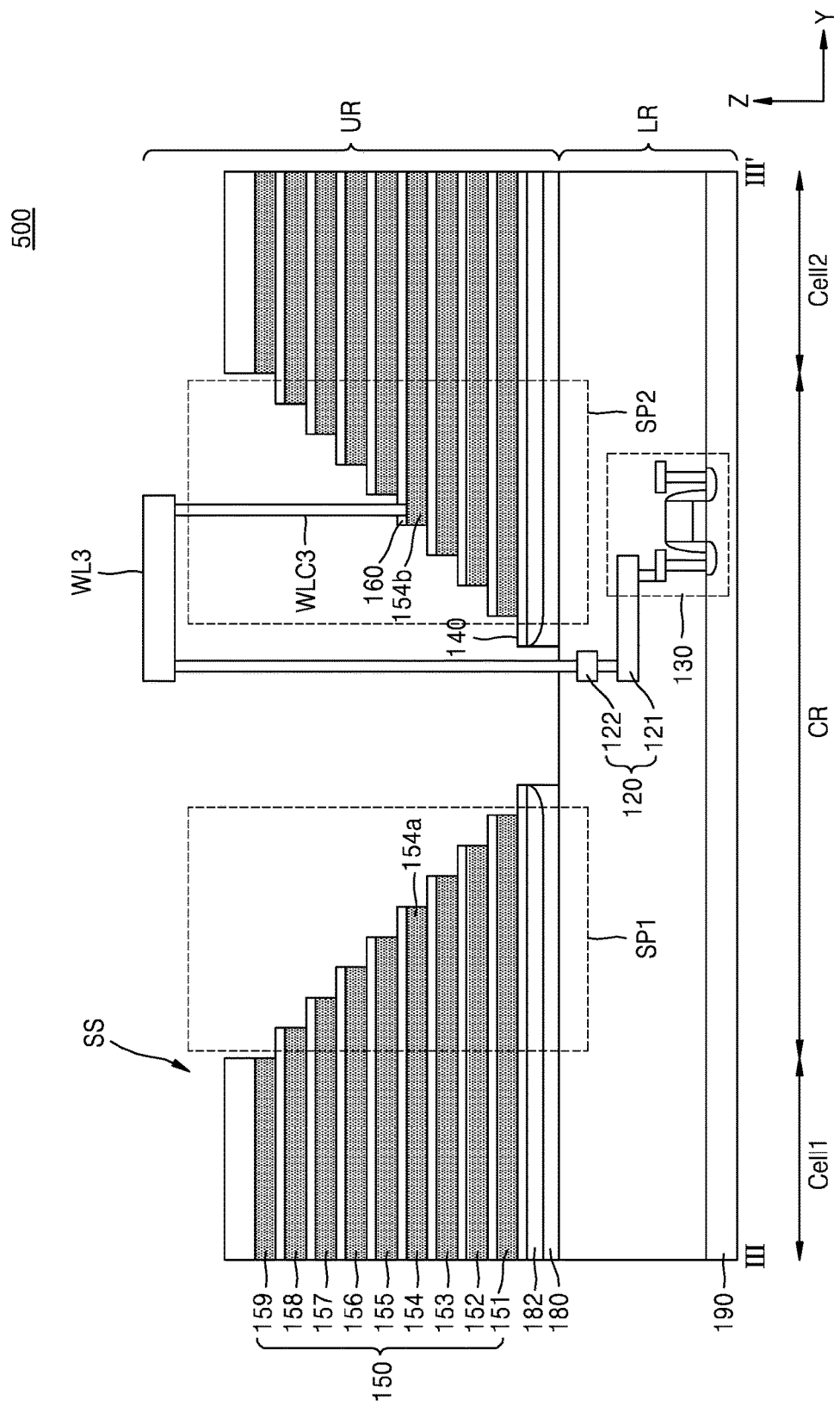
FIG. 15B is a cross-sectional view taken along a line III-III' of FIG. 15A.
Figure 15C:
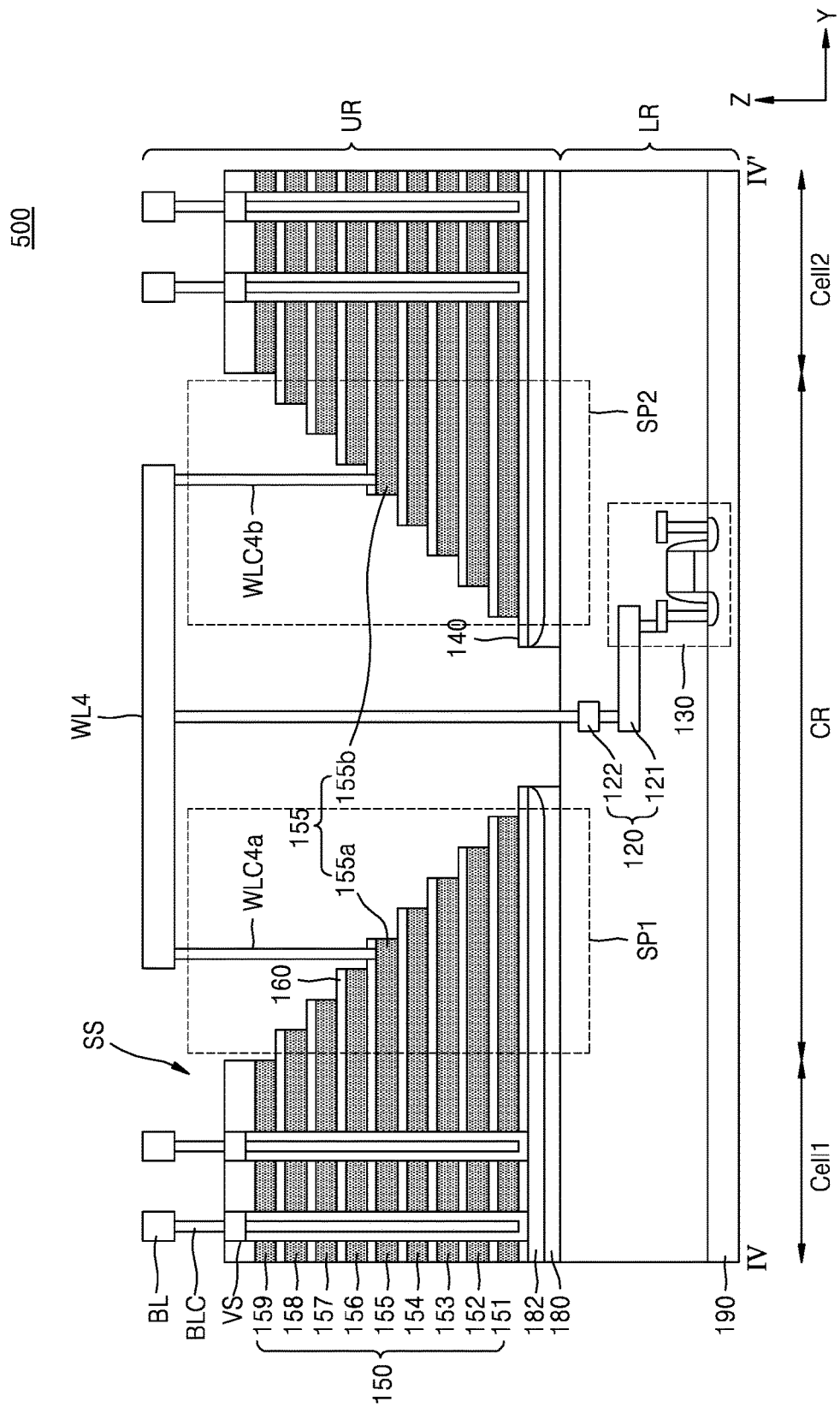
FIG. 15C is a cross-sectional view taken along a line IV-IV' of FIG. 15A.

FIG. 15A is a detailed plan view of the 3D nonvolatile memory device 400 shown in FIGS. 13A and 13B. FIG. 15B is a cross-sectional view taken along a line III-III' of FIG. 15A. FIG. 15C is a cross-sectional view taken along a line IV-IV' of FIG. 15A.

Referring to FIGS. 15A and 15B, according to an embodiment, the word-line contact WLC3 that connects a layer of the plurality of conductive layers 150 in a lower portion of the stacked structure SS, such as the fourth conductive layer 154, to a word line, such as the third word line WL3, may be disposed at either the first step portion SP1 or the second step portion SP2. As shown in FIG. 14, since the third portion 154c connects the first portion 154a and the second portion 154b, it is enough if one word-line contact WLC3 is connected to either the first portion 154a or the second portion 154b.

In addition, referring to FIGS. 15A and 15C, according to an embodiment, to connect a layer of the plurality of conductive layers 150 in an upper portion of the stacked structure SS, such as the fifth conductive layer 155, to a word line, such as the fourth word line WL4, the first step portion SP1 and the second step portion SP2 need two word-line contacts WLC4a and WLC4b, respectively. The fifth conductive layer 155 includes the first portion 155a and the second portion 155b that are separated from each other as shown in FIG. 14 and the two word-line contacts WLC4a and WLC4b are connected to the first portion 155a and the second portion 155b, respectively. The two word-line contacts WLC4a and WLC4b are connected to an upper wiring, such as the fourth word line WL4. That is, the first portion 155a and the second portion 155b are connected to each other through an upper conductive line located at a higher level than the stacked structure SS.

Figure 16A:
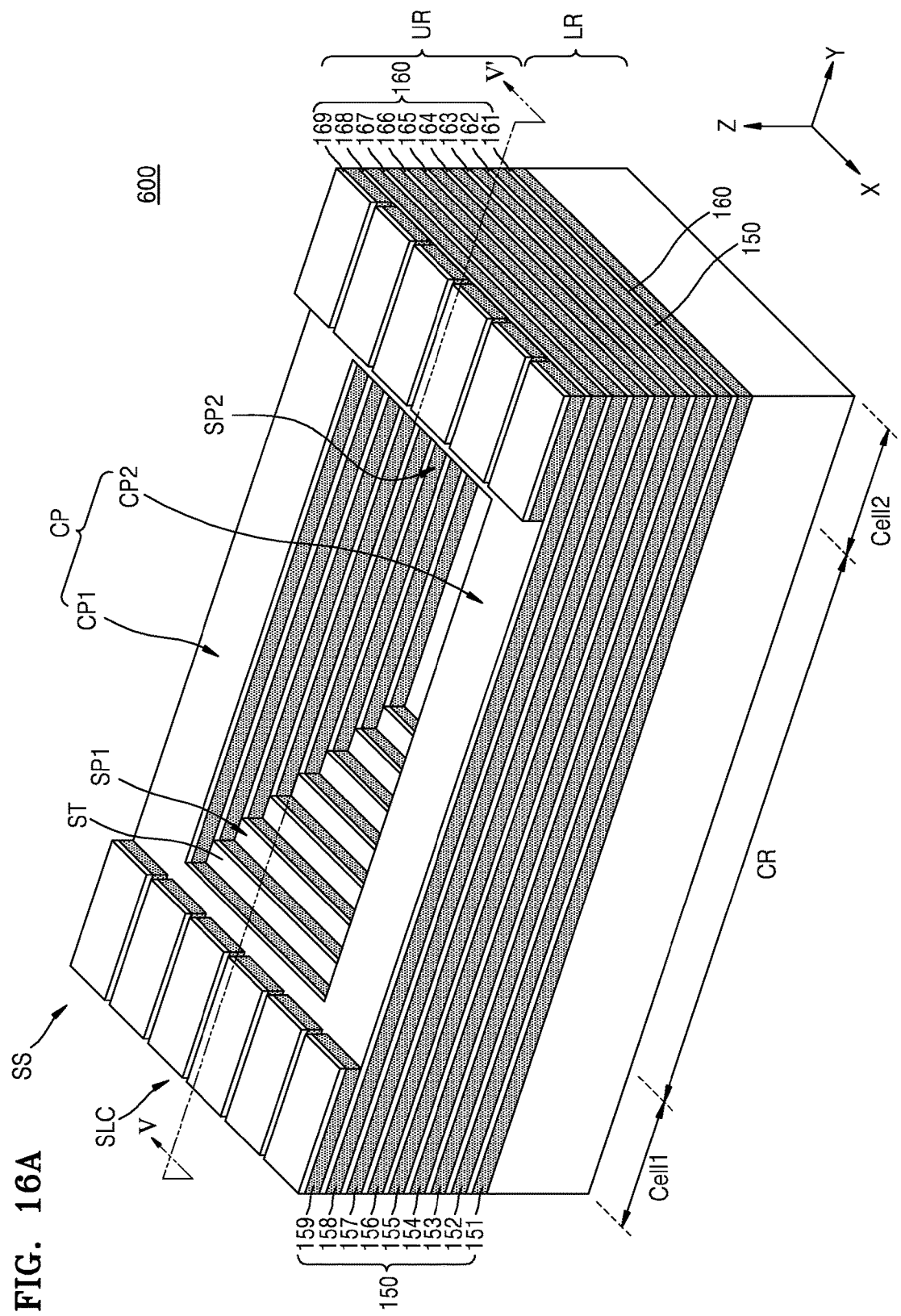
FIG. 16A is a perspective view of a 3D nonvolatile memory device according to an embodiment of the inventive concept.
Figure 16B:
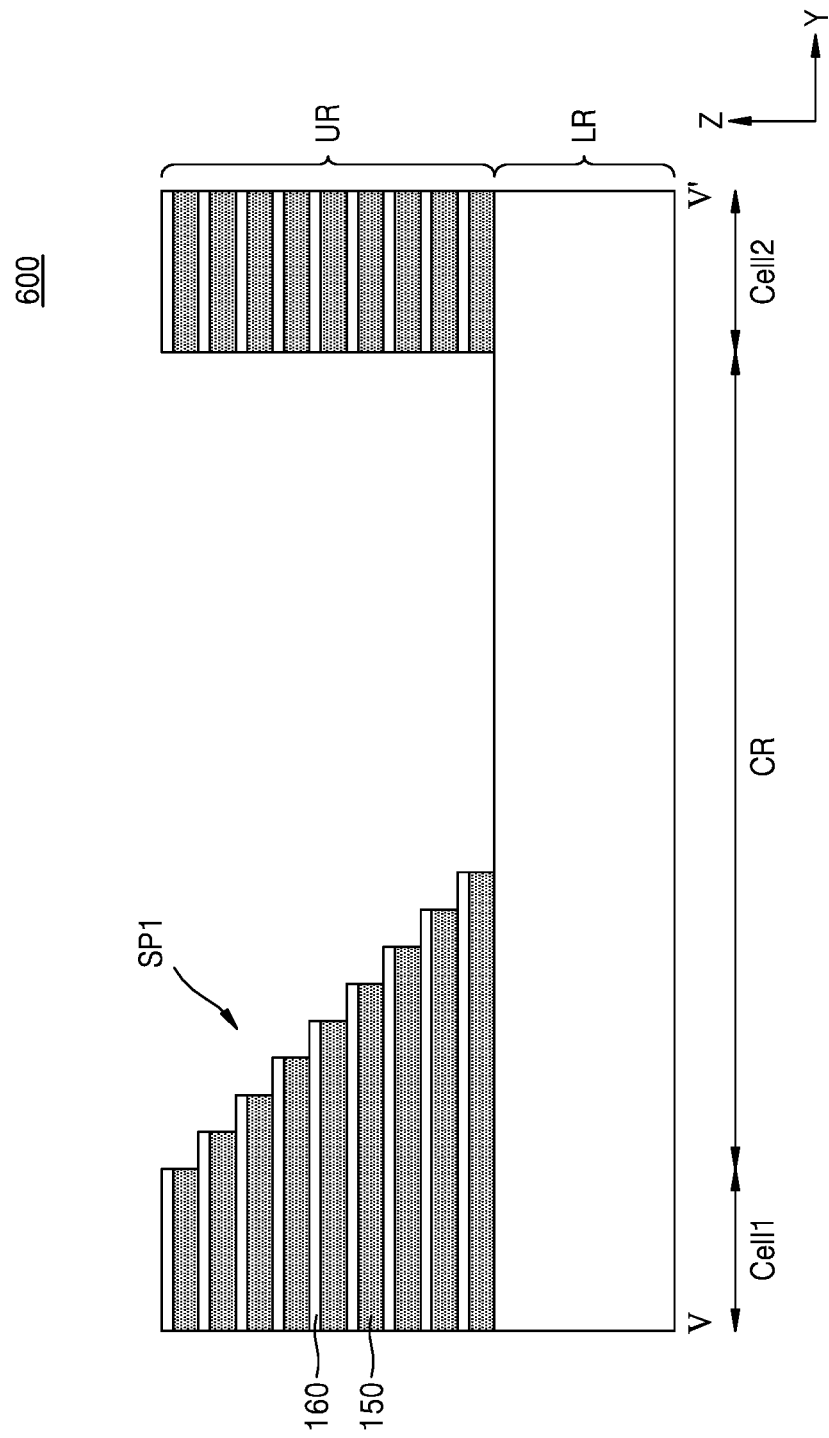
FIG. 16B is a cross-sectional view taken along a line V-V' of FIG. 16A.

FIG. 16A is a perspective view of a 3D nonvolatile memory device 600 according to an embodiment of the inventive concept. FIG. 16B is a cross-sectional view taken along a line V-V' of FIG. 16A. Hereinafter, the 3D nonvolatile memory device 600 according to a present embodiment will be described by focusing on differences from embodiments of FIGS. 3A and 3B.

Referring to FIGS. 16A and 16B, according to an embodiment, the connection region CR of the stacked structure SS of the 3D nonvolatile memory device 600 according to a present embodiment includes the first step portion SP1 and the connection portion CP but no second step portion SP2. That is, a sidewall of the second cell region Cell2 that faces the first cell region Cell1 is flat.

Figure 17:
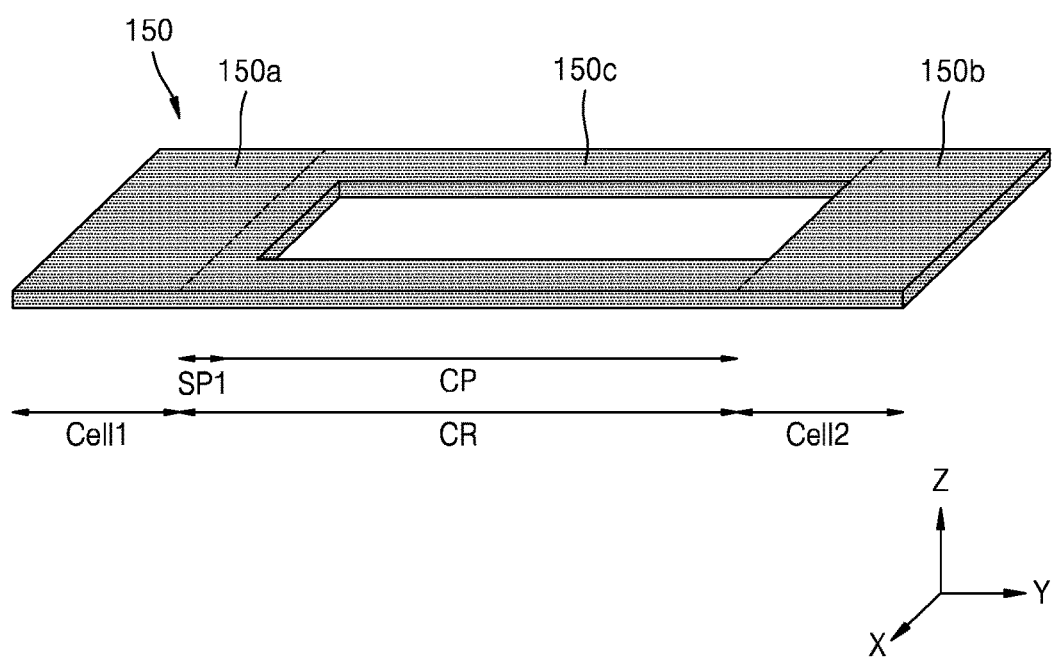
FIG. 17 is a perspective view of one of a plurality of conductive layers shown in FIG. 16A.

FIG. 17 is a perspective view of one of a plurality of conductive layers shown in FIG. 16A.

Referring to FIG. 17, according to an embodiment, the conductive layer 150 extends over the first cell region Cell1, the first step portion SP1, the connection portion CP, and the second cell region Cell2. The conductive layer 150 includes the first portion 150a in the first cell region Cell1, the second portion 150b in the second cell region Cell2, and the third portion 150c in the connection region CR. The third portion 150c extends over the connection portion CP and the first step portion SP1. The third portion 150c connects the first portion 150a and the second portion 150b.

Figure 18A:
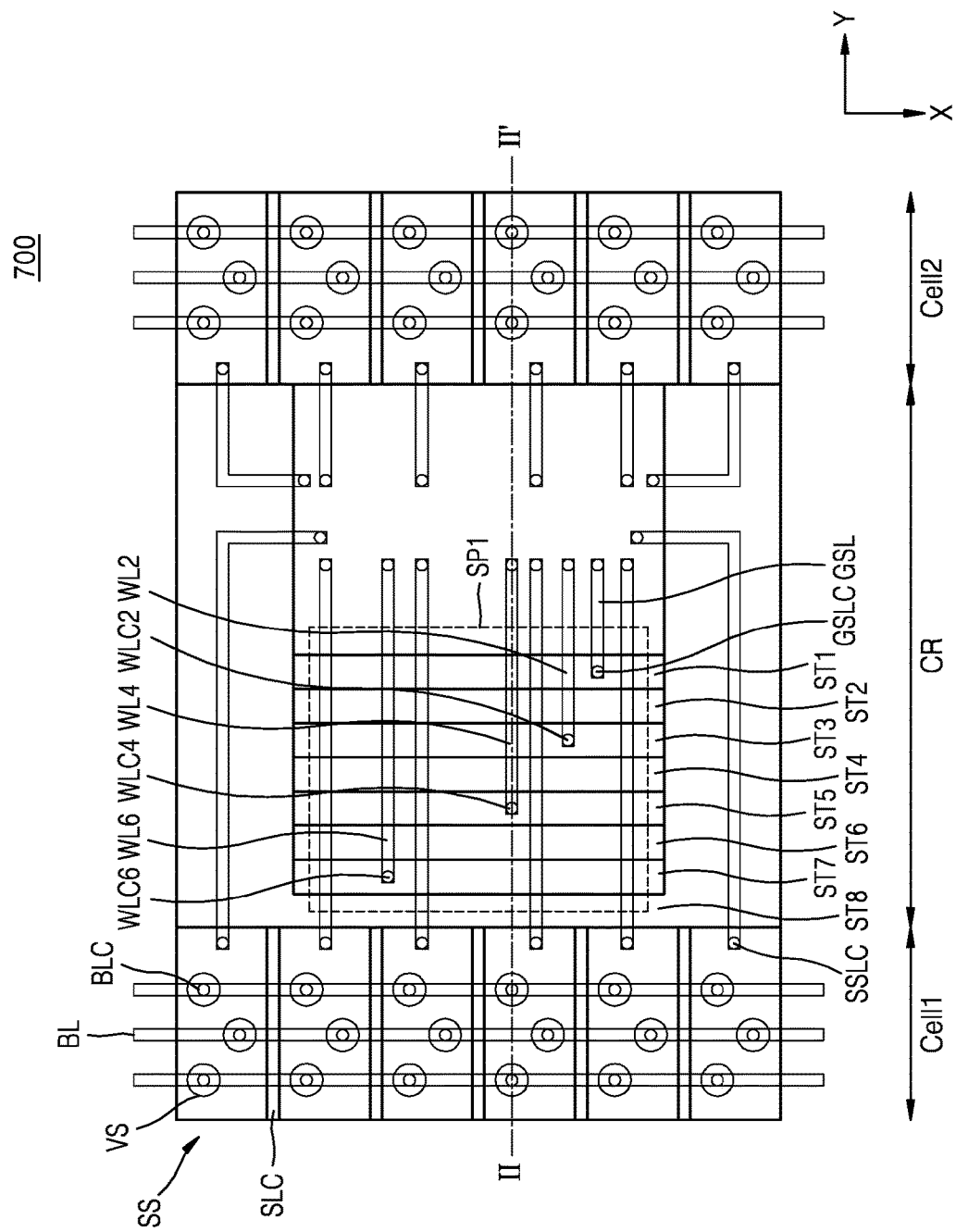
FIG. 18A is a detailed plan view of a 3D nonvolatile memory device shown in FIGS. 16A and 16B.
Figure 18B:
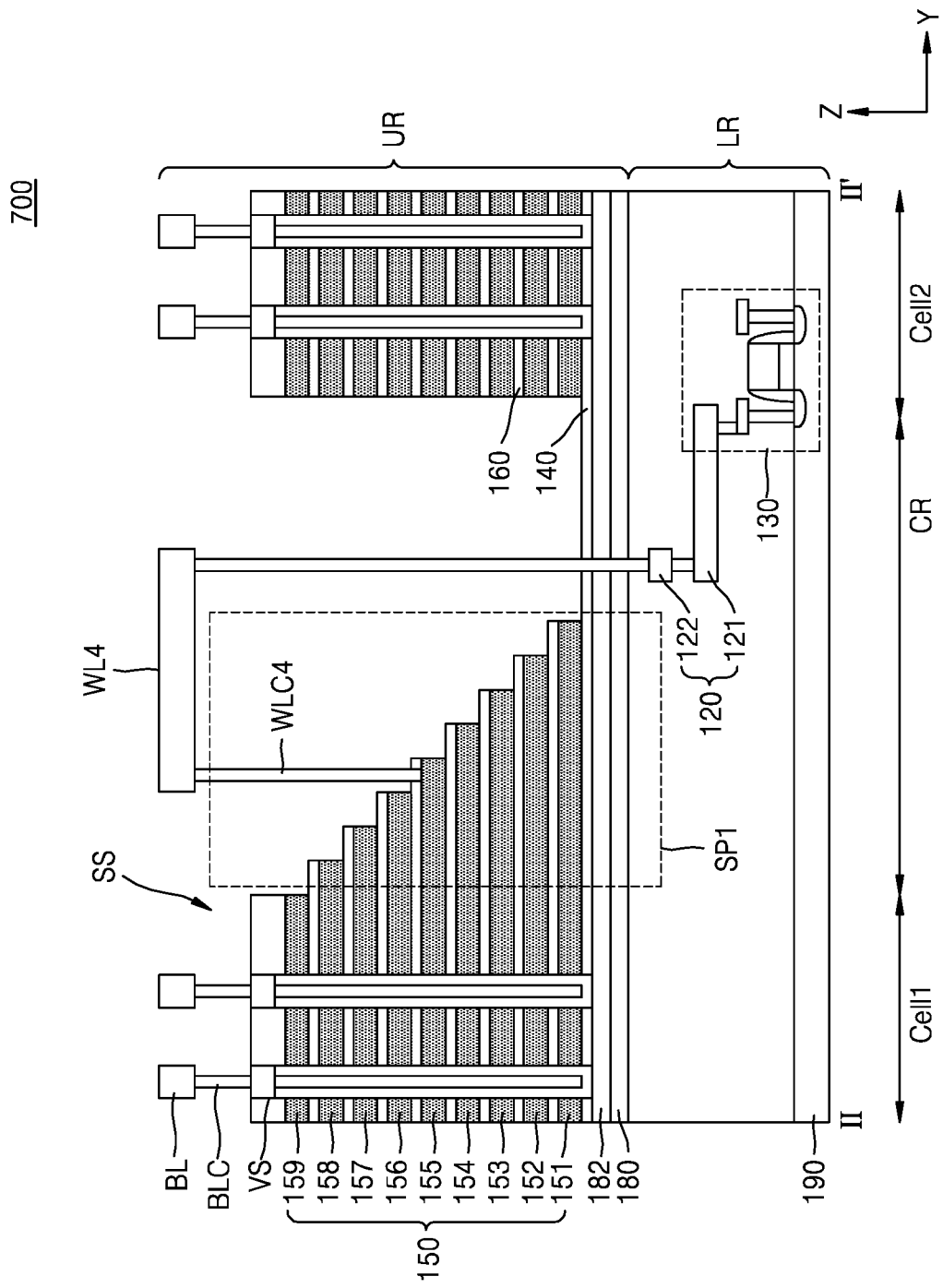
FIG. 18B is a cross-sectional view taken along a line II-II' of FIG. 18A.

FIG. 18A is a detailed plan view of the 3D nonvolatile memory device 600 shown in FIGS. 16A and 16B. FIG. 18B is a cross-sectional view taken along a line II-II' of FIG. 18A. Hereinafter, a present embodiment will be described by focusing on differences from embodiments of FIGS. 5A and 5B.

Referring to FIGS. 18A and 18B, according to an embodiment, one integrated upper substrate 180 is disposed below one stacked structure SS. The word-line contacts WLC1 to WLC7 are connected to the first step portion SP1 of the connection region CR of the stacked structure SS. For example, FIG. 18B shows that the word-line contact WLC4 that connects the fifth conductive layer 155 to the fourth word line WL4 is located at the first step portion SP1. All of the word-line contacts WLC1 to WLC7 that are connected to all of the word lines, such as the first to seventh word lines WL1 to WL7, are disposed in the first step portion SP1. Since the second step portion SP2 is omitted, a Y-direction length of the connection region CR is reduced. Accordingly, a size of a 3D nonvolatile memory device 700 according to an embodiment of the inventive concept can be reduced.

According to some embodiments, at least one of the steps ST of the first step portion SP1 includes the sub steps SST1 and SST2 as shown in FIG. 9.

Figure 19:
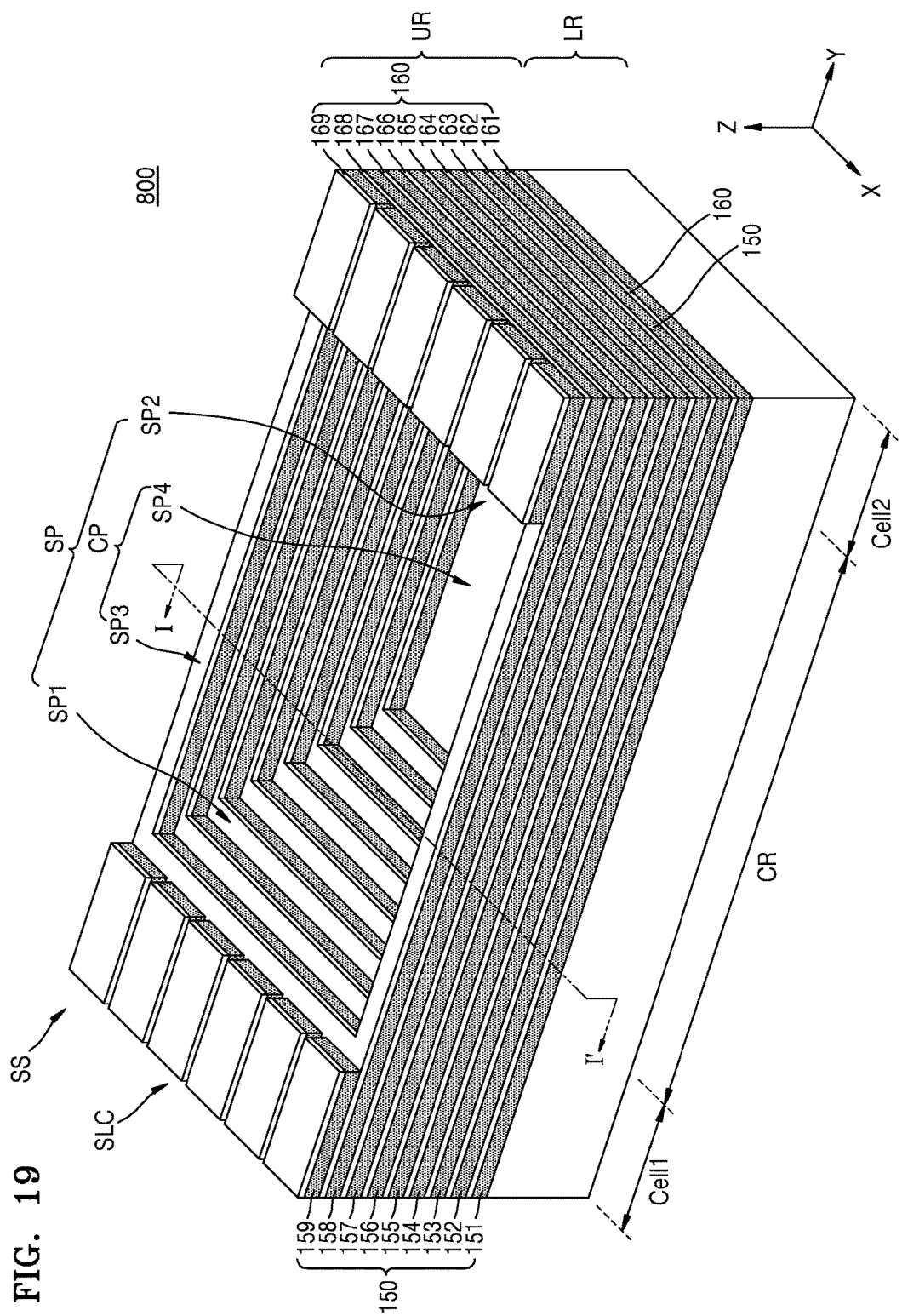
FIG. 19 is a perspective view of a 3D nonvolatile memory device according to an embodiment of the inventive concept.
Figure 20A:
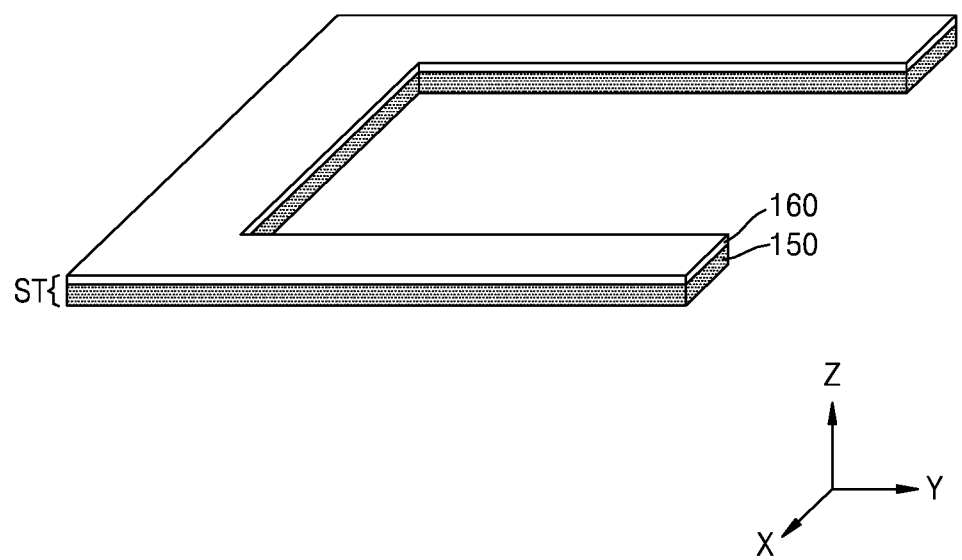
FIG. 20A is a perspective view of one of a plurality of steps of a step portion of FIG. 19.
Figure 20B:
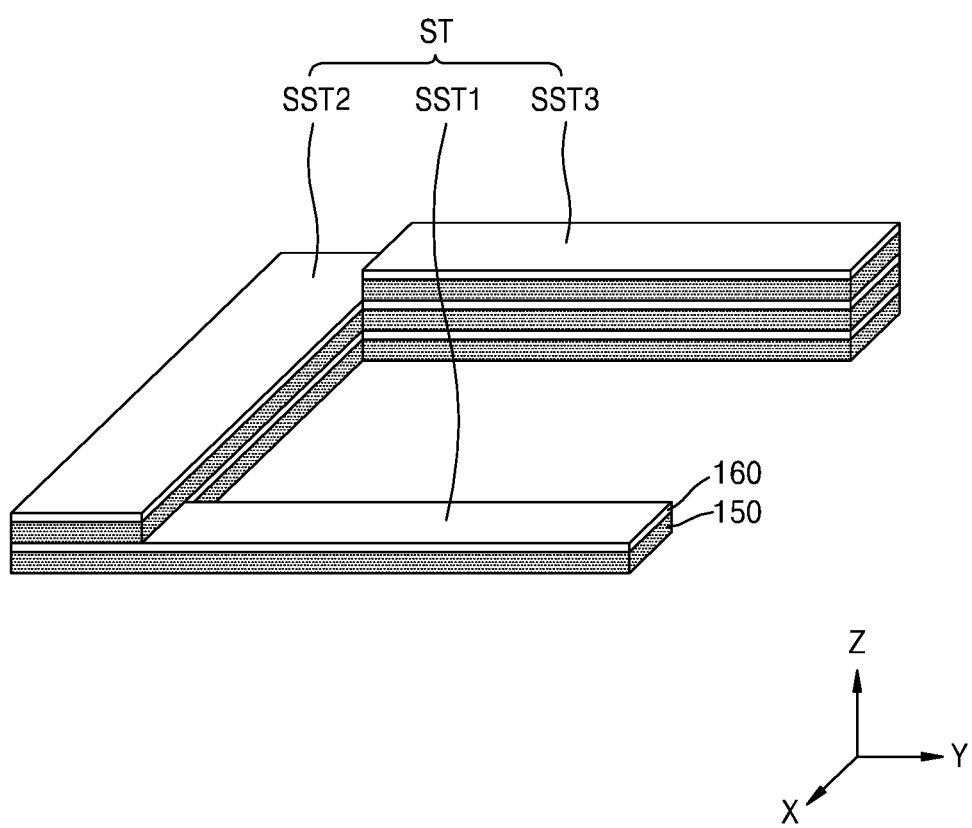
FIG. 20B is a perspective view of a variation of a step of FIG. 20A.

FIG. 19 is a perspective view of a 3D nonvolatile memory device 800 according to an embodiment of the inventive concept. FIG. 20A is a perspective view of one of a plurality of steps of a step portion of FIG. 19. FIG. 20B is a perspective view of a variation of a step of FIG. 20A. Hereinafter, the 3D nonvolatile memory device 800 according to a present embodiment will be described by focusing on differences from an embodiment of FIG. 16A.

According to the 3D nonvolatile memory device 800 according to a present embodiment, the connection portion CP of the stacked structure SS includes the third step portion SP3 and the fourth step portion SP4. The third step portion SP3 connects the first step portion SP1 and the second cell region Cell2. The fourth step portion SP4 also connects the first step portion SP1 and the second cell region Cell2. Each of the third step portion SP3 and the fourth step portion SP4 has a stepped shape that descends in directions toward each other. A cross section of the connection portion CP cut along the line I-I' is the same as that of FIG. 10C. The entirety of a sidewall of the second cell region Cell2 that faces the first step portion SP1 is flat. As shown in FIG. 10C, the third step portion SP3 and the fourth step portion SP4 are spaced apart from each other in the X-direction. The width W3 in the X-direction of the third step portion SP3 and the width W4 in the X-direction of the fourth step portion SP4 increases toward the lower region LR. The distance D in the X-direction between the third step portion SP3 and the fourth step portion SP4 decreases toward the lower region LR.

In other words, according to an embodiment, the connection region CR of the stacked structure SS includes the step portion SP, and the step portion SP includes the first step portion SP1, the third step portion SP3, and the fourth step portion SP4. Referring to FIG. 20A, each step ST of the step portion SP has a right-angled U-shape or an annular rectangular shape that is missing one of the four sides. Referring to FIG. 20B, according to some embodiments, each step ST of the step portion SP includes the sub steps SST1 to SST3.

According to some embodiments, similar to the embodiments of FIGS. 13A and 13B, the third step portion SP3 and the fourth step portion SP4 connect a lower portion of the first step portion SP1 and a lower portion of the second cell region Cell2 but not an upper portion of the first step portion SP1 and an upper portion of the second cell region Cell2.

Figure 21:
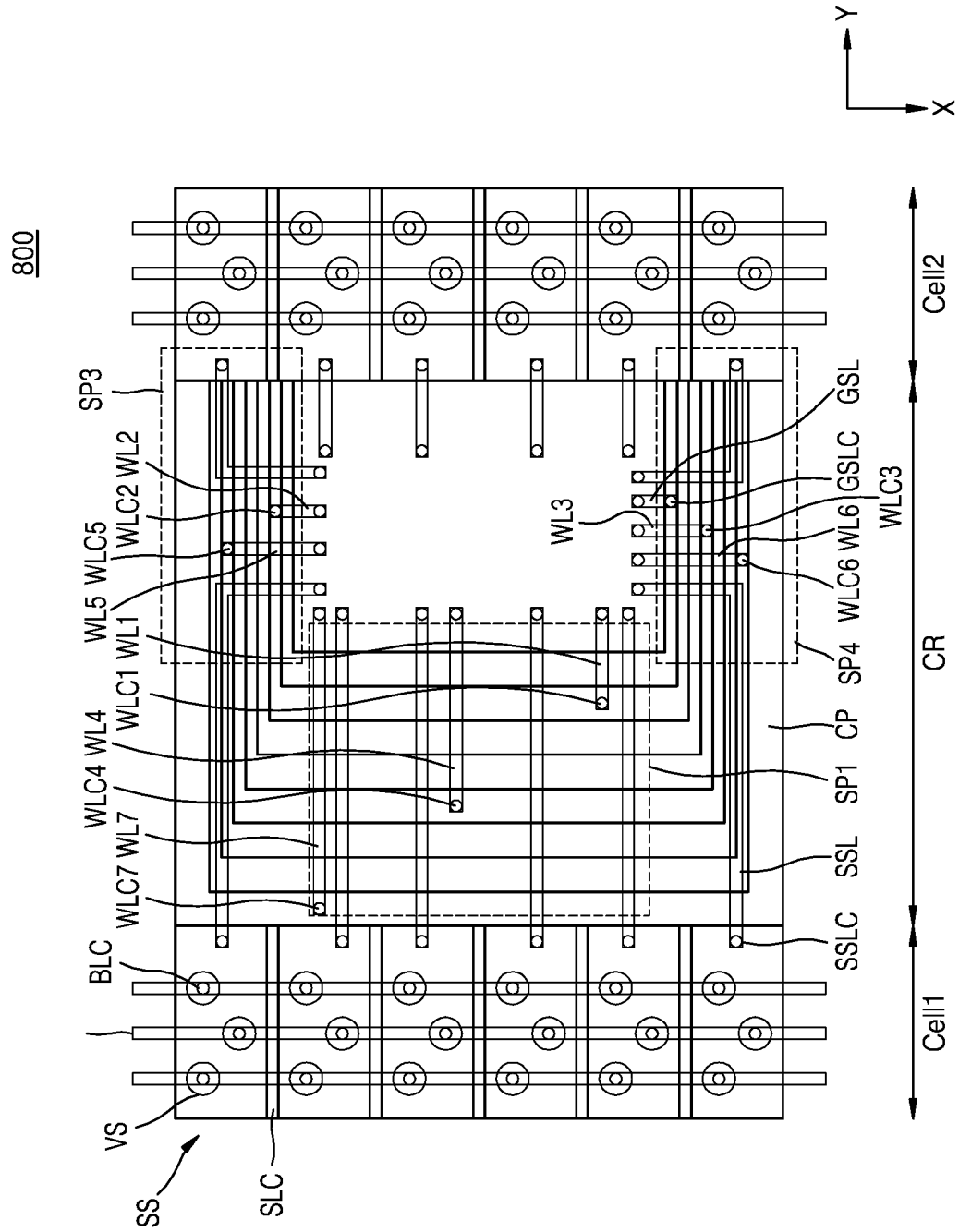
FIG. 21 is a detailed plan view of a 3D nonvolatile memory device shown in FIG. 19.

FIG. 21 is a detailed plan view of the 3D nonvolatile memory device 800 shown in FIG. 19. Hereinafter, the 3D nonvolatile memory device 800 according to a present embodiment will be described by focusing on differences from an embodiment of FIG. 18A.

Referring to FIG. 21, according to a present embodiment, at least some of the word-line contacts WLC1 to WLC7 are connected to the third step portion SP3 and the fourth step portion SP4 as well as the first step portion SP1 of the connection region CR of the stacked structure SS. For example, word-line contact WLC1 connected to the first word line WL1, word-line contact WLC4 connected to the fourth word line WL4, and word-line contact WLC7 connected to the seventh word line WL7 are located in the first step portion SP1, word-line contact WLC2 connected to second word line WL2 and word-line contact WLC5 connected to the fifth word line WL5 are located in the third step portion SP3, and word-line contact WLC3 connected to the third word line WL3 and word-line contact WLC6 connected to the sixth word line WL6 are located in the fourth step portion SP4. A sufficient space for the word-line contacts WLC1 to WLC7 is ensured because at least some of the word-line contacts WLC1 to WLC7 are disposed in the third step portion SP3 and the fourth step portion SP4.

According to another embodiment, the word-line contacts WLC1 to WLC7 are disposed in the first step portion SP1 but not in the third step portion SP3 and the fourth step portion SP4.

While embodiments of the inventive concept have been particularly shown and described with reference to exemplary embodiments thereof, it will be understood that various changes in form and details may be made therein without departing from the spirit and scope of the following claims.

What is claimed is:

1. A three-dimensional (3D) nonvolatile memory comprising:
   a stacked structure that includes a plurality of conductive layers that alternate with and are spaced apart from each other by a plurality of interlayer insulating layers, wherein the stacked structure includes a first cell region, a second cell region spaced apart from the first cell region, a connection region between the first cell region and the second cell region; and
   a hole,
   wherein the connection region includes a first step portion that contacts the first cell region and has a stepped shape that descends in a direction approaching the second cell region, a second step portion that contacts the second cell region and has a stepped shape that descends in a direction approaching the first cell region, and a connection portion that connects the first cell region and the second cell region, and
   wherein the hole is surrounded by the first step portion, the second step portion, and the connection region and exposes a lower region below the stacked structure.

2. The 3D nonvolatile memory of claim 1, wherein one sidewall of the connection portion is aligned with one sidewall of the first cell region and one sidewall of the second cell region.

3. The 3D nonvolatile memory of claim 1, wherein at least one of steps of the first step portion is at a same level as one of steps of the second step portion.

4. The 3D nonvolatile memory of claim 1, further comprising:
   a lower region disposed below the stacked structure and that includes a peripheral circuit, wherein portions of the plurality of conductive layers disposed in the first cell region and portions of the plurality of conductive layers disposed in the second cell region are electrically connected to the peripheral circuit.

5. The 3D nonvolatile memory of claim 1, wherein each of the plurality of conductive layers extends over the first cell region, the first step portion, the connection portion, the second step portion, and the second cell region.

6. The 3D nonvolatile memory of claim 1, wherein at least one step of the first step portion and the second step portion has a plurality of sub steps that have different widths in one direction.

7. The 3D nonvolatile memory of claim 1, wherein a width of the connection portion in a direction perpendicular to a direction from the first step portion to the second step portion increases with decreasing height from a lower end of the connection portion.

8. The 3D nonvolatile memory of claim 1, wherein the connection portion includes a third step portion and a fourth step portion, each connecting the first step portion and the second step portion and each having a stepped shape that descends in a direction in which the third step portion and the fourth step portion face each other.

9. The 3D nonvolatile memory of claim 1, wherein the connection portion connects a lower portion of the first step portion and a lower portion of the second step portion but not an upper portion of the first step portion and an upper portion of the second step portion.

10. A three-dimensional (3D) nonvolatile memory comprising:
    a lower region that includes a lower substrate and a peripheral circuit on the lower substrate; and
    a stacked structure on the lower region, wherein the stacked structure includes a plurality of conductive layers that alternate with and are spaced apart from each other by a plurality of interlayer insulating layers, wherein
    the stacked structure includes a first cell region, a second cell region spaced apart from the first cell region, and a connection region between the first cell region and the second cell region, and
    the connection region of the stacked structure includes a step portion that has a stepped shape that descends from a periphery of the connection region toward a center thereof,
    wherein at least some of steps of the step portion have an annular rectangular shape.

11. The 3D nonvolatile memory of claim 10, wherein at least one of the plurality of conductive layers within the stacked structure includes a first portion in the first cell region, a second portion in the second cell region, and a third portion in the connection region that connects the first portion and the second portion.

12. The 3D nonvolatile memory of claim 10, wherein at least one of the plurality of conductive layers within an upper portion of the stacked structure includes a first portion in the first cell region and a second portion in the second cell region that is spaced apart from the first portion, and the first portion and the second portion are connected to each other through an upper conductive line disposed at a higher level than the stacked structure.

13. The 3D nonvolatile memory of claim 10, wherein the step portion includes a first step portion, a second step portion, a third step portion and a fourth step portion, wherein the first step portion contacts the first cell region and has a stepped shape that descends in a direction approaching the second cell region, the second step portion contacts the second cell region and has a stepped shape that descends in a direction toward the first cell region, each of the third step portion and the fourth step portion connects the first step portion and the second step portion and each of the third step portion and the fourth step portion has a stepped shape that descends in a direction toward each other.

14. The 3D nonvolatile memory of claim 13, further comprising:
    a plurality of contacts located in the first step portion, the second step portion, the third step portion, and the fourth step portion, wherein plurality of contacts electrically connect the plurality of conductive layers to the peripheral circuit.

15. A three-dimensional (3D) nonvolatile memory comprising:
a lower region that includes a lower substrate and a peripheral circuit on the lower substrate;
an upper substrate on the lower region;
a stacked structure on the upper substrate that includes a plurality of conductive layers that alternate with and are spaced apart from each other by a plurality of interlayer insulating layers; and
a plurality of contacts that electrically connect each of the plurality of conductive layers to the peripheral circuit, wherein
the stacked structure includes a first cell region, a second cell region spaced apart from the first cell region, and a connection region between the first cell region and the second cell region,
the connection region includes a first step portion that contacts the first cell region and has a stepped shape that descends in a direction toward the second cell region, and a connection portion that connects the first step portion and the second cell region, and the plurality of contacts are disposed in the first step portion.

16. The 3D nonvolatile memory of claim 15, wherein the second cell region includes a flat sidewall that faces the first step portion.

17. The 3D nonvolatile memory of claim 15, wherein each of the plurality of conductive layers extends over the first cell region, the first step portion, the connection portion, and the second cell region.

18. The 3D nonvolatile memory of claim 15, wherein the connection portion includes a third step portion and a fourth step portion spaced apart from the third step portion, wherein each of the third step portion and the fourth step portion connects the first step portion and the second cell region and has a stepped shape that descends in a direction toward each other.

19. The 3D nonvolatile memory of claim 15, wherein the connection portion includes two portions spaced apart from each other in a first direction, wherein a width in the first direction of each of the two portions increases with decreasing distance from the lower region, and a distance in the first direction between the two portions decreases with decreasing distance from the lower region.

* * * * *